US011834328B2

(12) United States Patent
Eslampour et al.

(10) Patent No.: US 11,834,328 B2
(45) Date of Patent: Dec. 5, 2023

(54) SEMICONDUCTOR PACKAGE WITH BUILT-IN VIBRATION ISOLATION, THERMAL STABILITY, AND CONNECTOR DECOUPLING

(71) Applicant: InvenSense, Inc., San Jose, CA (US)

(72) Inventors: Hamid Eslampour, San Jose, CA (US); Karthik Katingari, San Jose, CA (US); Adam Martin, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 207 days.

(21) Appl. No.: 17/202,070

(22) Filed: Mar. 15, 2021

(65) Prior Publication Data

US 2021/0403318 A1 Dec. 30, 2021

Related U.S. Application Data

(60) Provisional application No. 63/045,368, filed on Jun. 29, 2020.

(51) Int. Cl.
*B81B 7/00* (2006.01)
*B81C 3/00* (2006.01)

(52) U.S. Cl.
CPC .......... *B81B 7/0058* (2013.01); *B81C 3/001* (2013.01); *B81B 2207/012* (2013.01);
(Continued)

(58) Field of Classification Search
CPC .......... B81B 7/0058; B81B 2207/012; B81B 2207/098; B81B 2201/0235;
(Continued)

(56) References Cited

U.S. PATENT DOCUMENTS 7,000,298 B2 * 2/2006 Cook .................... G01L 9/0025
29/594
9,878,904 B1 * 1/2018 Potasek ................. B81C 1/0023
(Continued)

FOREIGN PATENT DOCUMENTS

DE 11 2011 103 465 T5 8/2013
EP 2 868 625 A1 5/2015
TW 201126688 A 8/2011

OTHER PUBLICATIONS

Machine Translation of DE102013222307 (Year: 2015).*
International Search Report and Written Opinion in International Application No. PCT/US2021/037494, dated Sep. 23, 2021.

*Primary Examiner* — Yasser A Abdelaziez
(74) *Attorney, Agent, or Firm* — DLA Piper LLP (US)

(57) ABSTRACT

A semiconductor package with design features, including an isolation structure for internal components and a flexible electrical connection, that minimizes errors due to environmental temperature, shock, and vibration effects. The semiconductor package may include a base having a first portion surrounded by a second portion. A connector assembly may be attached to the first portion. The connector assembly may extend through an opening in the base. A lid attached may be attached to, at least, the second portion. The attached lid may form a hermetically-sealed cavity defined by an upper surface of the first portion, the connector assembly, and an inner surface of the lid. An elastomer pad may be on the first portion and a sub-assembly may be on the elastomer pad. A flexible electrical connection may be formed between the connector assembly and the sub-assembly.

21 Claims, 21 Drawing Sheets

(52) U.S. Cl.
CPC . *B81B 2207/098* (2013.01); *B81C 2203/0109* (2013.01); *B81C 2203/032* (2013.01)

(58) Field of Classification Search
CPC ........ B81B 2201/0242; B81B 2207/07; B81B 3/0081; B81C 3/001; B81C 2203/0109; B81C 2203/032
See application file for complete search history.

(56) References Cited

U.S. PATENT DOCUMENTS 10,101,234 B2 * 10/2018 Potasek ................ G01L 9/0072
2006/0197215 A1 9/2006 Potter

* cited by examiner

SEMICONDUCTOR PACKAGE WITH BUILT-IN VIBRATION ISOLATION, THERMAL STABILITY, AND CONNECTOR DECOUPLING

RELATED APPLICATIONS

This application claims the benefit of, and priority to, U.S. Provisional Patent Application Ser. No. 63/045,368, filed Jun. 29, 2020 and entitled "IMU Package Assembly," the disclosure of which is hereby incorporated by reference in its entirety.

TECHNICAL FIELD

The disclosure relates to microelectronic packages and processes for packaging semiconductor devices, and more particularly, to a package and method of packaging microelectro-mechanical systems (MEMS) sensor modules.

BACKGROUND

Micro-electro-mechanical systems (MEMS) devices, such as inertial measurement units (IMUs), may include various sensors, such as gyroscopes and accelerometers, which can be implemented in motion tracking systems. These sensors typically have microstructure sense elements that need protection from various environmental influences during fabrication and operation. For example, MEMS sensors that are designed to measure acceleration and rotational motion may be subjected to various error sources, such as outside stresses, which may degrade motion measurement. Although various packaging schemes have been developed to package sense elements in MEMS devices, these packaging schemes are typically costly and not always reliable.

SUMMARY

A microelectronics package with design features, including an isolation structure for internal components, that minimizes errors due to environmental temperature, shock, and vibration effects. The microelectronics package may include a base having a first portion surrounded by a second portion. A connector assembly may be attached to the first portion. The connector assembly may extend through an opening in the base. A lid attached may be attached to, at least, the second portion. The attached lid may form a hermetically-sealed cavity defined by an upper surface of the first portion, the connector assembly, and an inner surface of the lid. An elastomer pad may be on the first portion and a sub-assembly may be on the elastomer pad. A flexible electrical connection may be formed between the connector assembly and the sub-assembly.

A method of forming the microelectronics package is described herein. The method may include forming an elastomer pad on a first portion of a base. A sub-assembly may be formed on the elastomer pad. A connector assembly may be attached to the first portion. The connector assembly may extend through an opening in the base. The sub-assembly and the connector assembly may be attached via a flexible electrical connection. A lid may be attached to at least a second portion of the base, the second portion surrounding the first portion. The attachment of the lid to the base may form a hermetically-sealed cavity defined by an upper surface of the first portion, the connector assembly, and an inner surface of the lid.

BRIEF DESCRIPTION OF THE DRAWINGS

The drawings described below are for illustration purposes only. The drawings are not intended to limit the scope of this disclosure.

DETAILED DESCRIPTION

Figure 1:
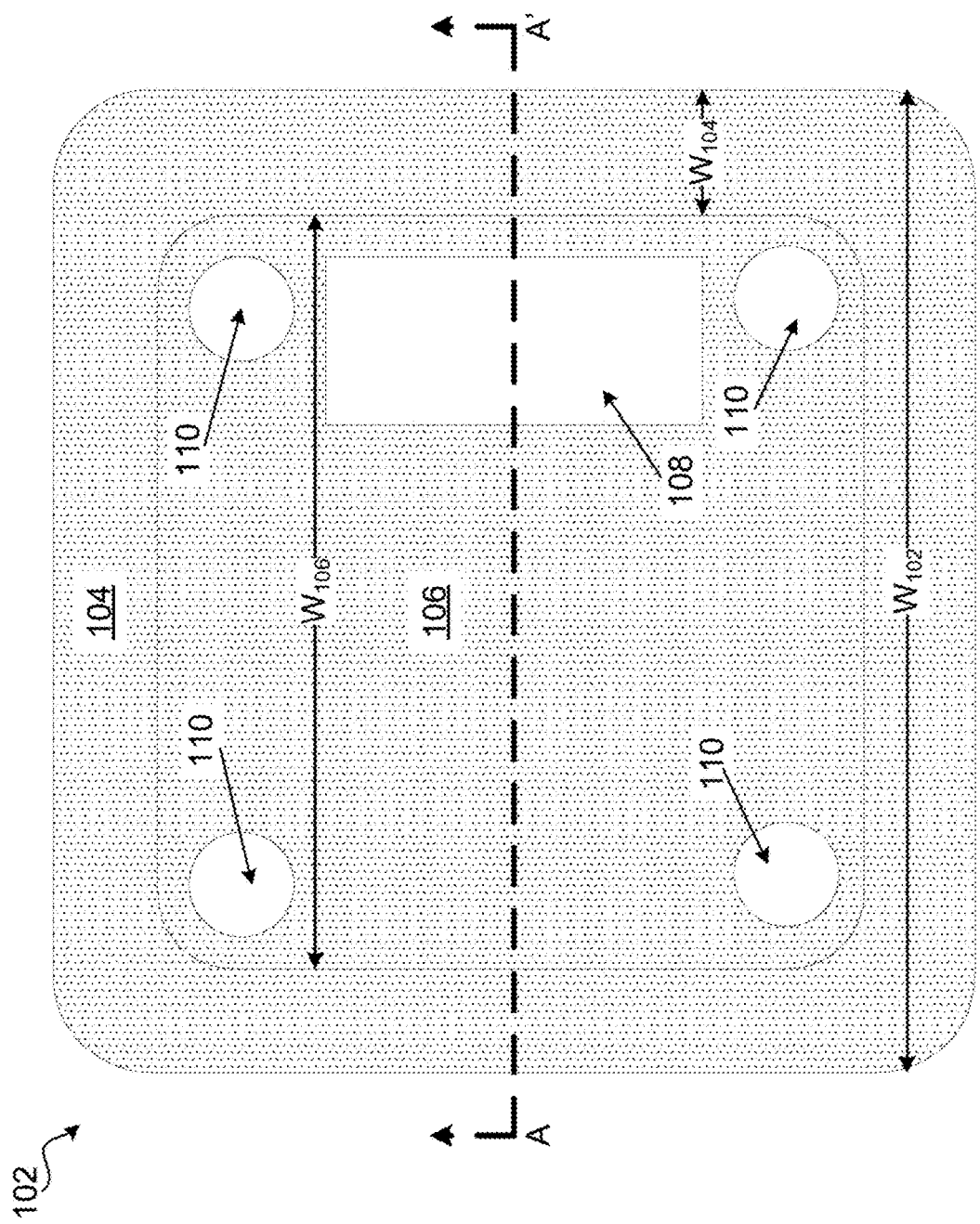
FIG. 1 is a top view of a base.

In the following detailed description, examples are described in sufficient detail to enable those skilled in the art to practice the following disclosure. It is to be understood that other examples may be utilized without departing from the scope of the disclosure. The following detailed description is, therefore, not to be taken in a limiting sense.

A packaging technique for Micro-Electro-Mechanical Systems (MEMS) devices is described herein. This approach may employ standard integrated circuit (IC) packaging techniques combined with an isolation structure that minimizes errors due to environmental temperature, shock, and vibration effects. This approach may be used with standard IC high volume production techniques, while having a lower cost because of the use of readily available materials.

MEMS devices packaged according to this method can be implemented in various sensor systems, such as an inertial measurement unit (IMU), for example. The packaging technique addresses the demanding size, cost, and performance issues of IMU products that employ MEMS sensors.

In general, this disclosure is directed to a microelectronics packaging (i.e., module) design whereby internal components, which may include one or more of sensor chips and integrated circuits are isolated from the external shock and vibration that may be imposed during the operating life of the module. The packaging design may include features for thermal isolation of the internal components from ambient temperature while minimizing the thermal gradient inside the module and around the internal components. These features may lead to enhanced and more stable performance since internal component may be less influenced by external vibration and temperature variations. In the described embodiments, IMU refers to MEMS sensor comprising one or more of accelerometer and gyroscope, and electronic circuits. The IMU may be a monolithic die or may be discrete dies comprising sensors and electronic circuits.

Our module design may include one or more of the following features: an internal vibration dampening feature, a cavity design to allow for thermal conductive material inclusion around the one or more semiconductor chips, and a built-in connector that enables an electrical connection between the internal components and a main printed circuit board (PCB). The electrical connection may be decoupled from a main sub-assembly within the module to meet vibration isolation requirements. Overall, these features may provide thermal and vibration isolation from the internal components from an ambient environment.

The module may include a lid and a base. The lid may be configured such that it provides for a locking mechanism to isolate the internal components and electrical connections from external insertion/extraction forces, for example, during PCB assembly. The base may allow for an electrical connection between the internal components and one or more exterior components (e.g., the PCB). An air cavity within the module may provide for additional thermal resistance in order to minimize the thermal conduction across the module and out to the ambient environment.

In an example, the internal components of the module may include a sub-assembly. The sub-assembly may include one or more active components. Thermal conductive material may be applied to the one or more active components (e.g., through an automated process) to enable temperature distribution around the one or more active components. The sub-assembly may be integrated inside the module while being isolated from external shock and vibration. The module may include a connector assembly to provide for an electrical connection between the sub-assembly and the one or more exterior components (e.g., the PCB). In an example, the connector assembly may include one or more of a flex-connector, an interposer, and a wire bond assembly. The connector assembly may isolate the sub-assembly from external shock and vibration.

These features may result in better performance of the internal components due to due to improved vibration isolation and thermal stability within the module. In addition, the proposed design may simplify assembly as compared to conventional packaging techniques and may result in a higher built-in functionality.

Referring now to FIG. 1, a top view of a base 102 is shown. The base 102 may be formed using one or more materials, including metal, ceramic, or a polymer such as a plastic. For applications in which it is desirable for the base 102 to provide radio frequency (RF) shielding and/or to transmit electrical signals, the base 102 be formed of metal, or can be formed of ceramic or plastic with a conductive layer. In an example, the base 102 may be formed from a pre-molded plastic (e.g., with leadframes).

The base 102 may have one or more portions. A first portion may be platform 106 and a second portion may be a rim 104. The rim 104 may surround the platform 106. In an example, the base 102 may be substantially square, rectangular, or circular in shape.

The base 102 may include one or more openings. For example, the platform 106 portion of the base 102 may include a connector opening 108 and one or more screw openings 110. Although shown as having a rectangular shape, the connector opening 108 may be of any desired size and/or shape to accommodate an electrical connector as described in additional detail below. In an example, the one or more screw openings 110 may include four openings located in proximity to the corners of the platform 106.

Figure 2:
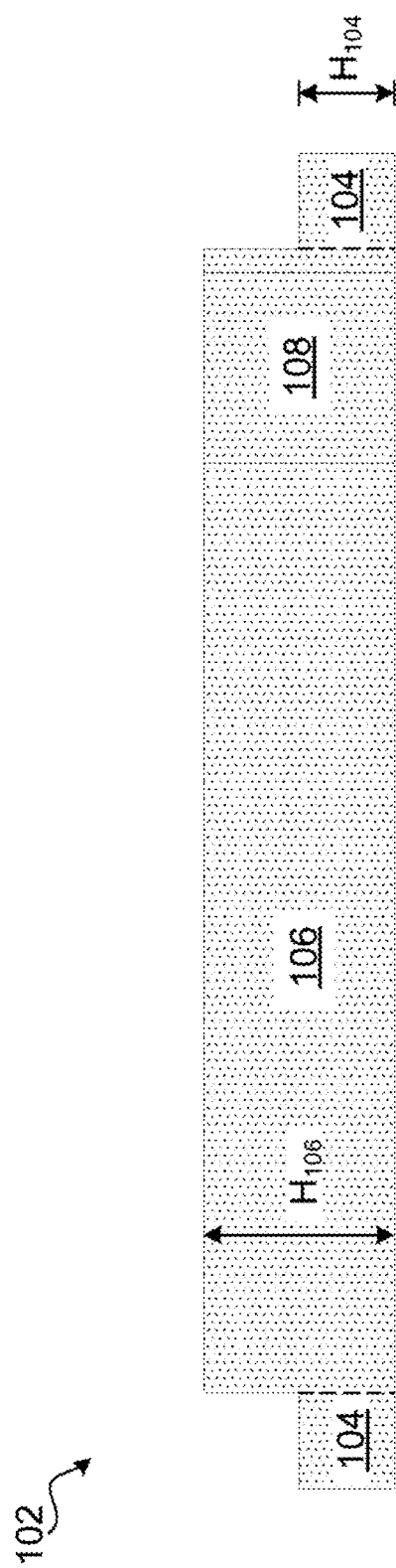
FIG. 2 is a cross-sectional view illustrating the base.

Referring now to FIG. 2, a cross-sectional view illustrating the base 102 is shown. The cross-sectional view may be from the perspective of line A-A' shown in FIG. 1. The rim 104 portion of the base 102 may have a height $H_{104}$. The platform 106 portion of the base 102 may have a height $H_{106}$.

Figure 3:
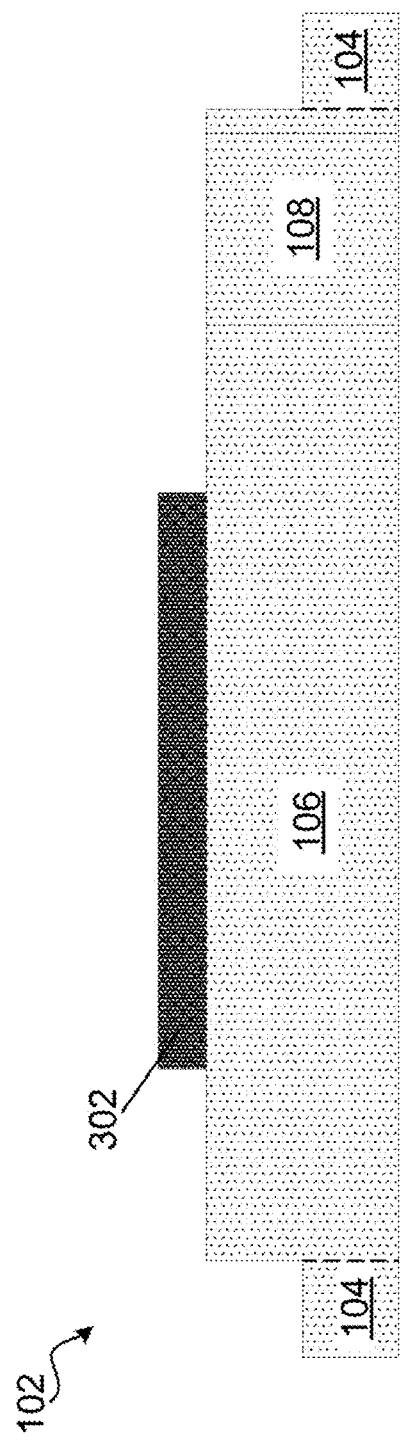
FIG. 3 is a cross-sectional view illustrating the formation of an elastomer pad.

Referring now to FIG. 3, a cross-sectional view illustrating the formation of an elastomer pad 302 is shown. In an example, the elastomer pad 302 may be formed on the platform 106 portion of the base 102. The elastomer pad 302 may be formed on the platform 106. The elastomer pad 302 may be composed of one or more conventional materials that can absorb and dampen vibration. The elastomer pad 302 may be composed of a material having a low storage modulus and a relatively high loss modulus. In an example, the elastomer pad 302 may be composed of one or more conventional silicone die adhesives. Some examples of commercially available silicone die attach adhesives that may be used to form the elastomer pad 302 are SEMICOSIL® 988, DOW® 7920, and Wacker® Lumisil® 245.

Figure 4:
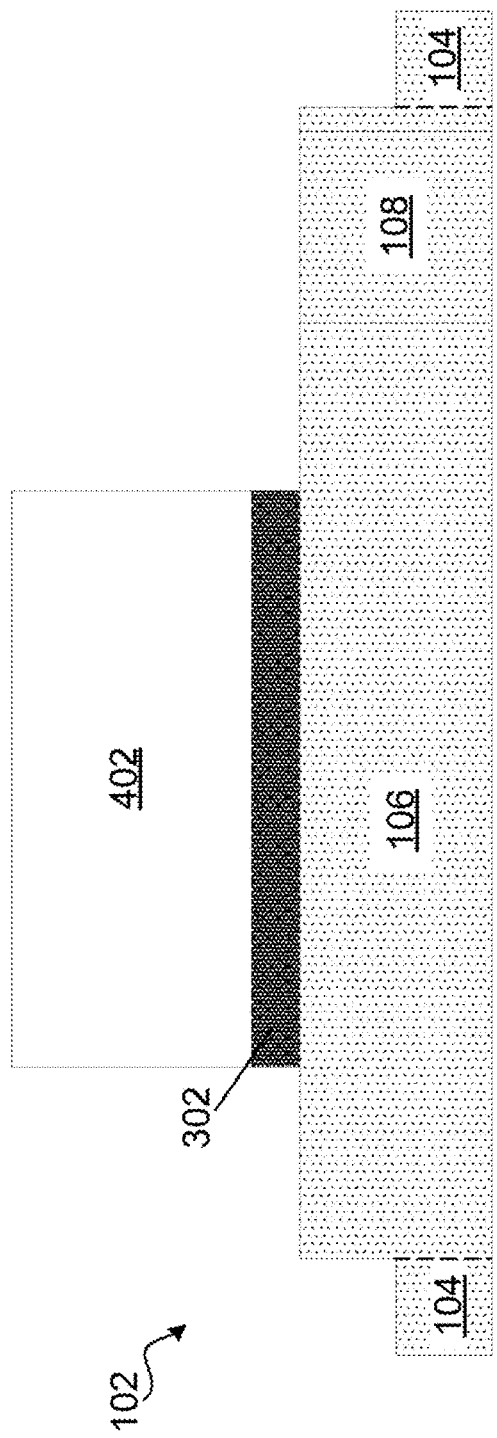
FIG. 4 is a cross-sectional view illustrating forming a sub-assembly on the elastomer pad.

Referring now to FIG. 4, a cross-sectional view illustrating forming a sub-assembly 402 on the elastomer pad 302 is shown. The sub-assembly 402 may include one or more active components, such as semiconductor chips and integrated circuits. Examples of different configurations for the sub-assembly 402 are described in additional detail below.

In one example, the sub-assembly 402 may be formed separately and may be picked and placed on the elastomer pad 302. In another example, the sub-assembly 402 may be formed in-situ on the elastomer pad 302. After the sub-assembly 402 is formed on the elastomer pad 302, the elastomer pad 302 may be allowed to cure. By forming the sub-assembly 402 on the elastomer pad 302, the sub-assembly 402 may be isolated from physical forces (e.g., vibration and shock) and temperature gradients that may travel through the base 102.

Figure 5:
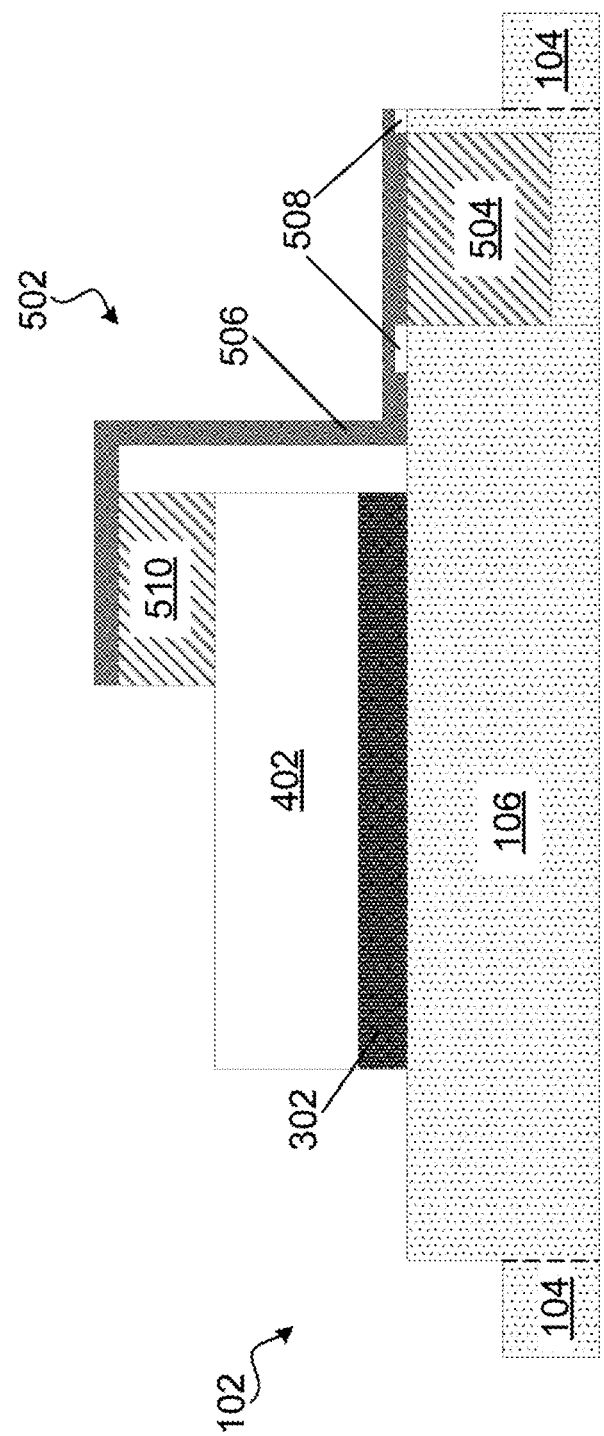
FIG. 5 is a cross-sectional view illustrating forming a first type of connector assembly.

Referring now to FIG. 5, a cross-sectional view illustrating forming a first type of connector assembly 502 is shown. The first type of connector assembly 502 may be a flexible electrical connection, such as a flexible printed circuit (FPC) and may include one or more of a flat flexible cable (FFC) 506, a first connector 504, and a second connector 510.

The first connector 504 and the second connector 510 may be electrically coupled by the FFC 506. The FFC 506 may be a miniaturized form of ribbon cable, which is also flat and flexible. The cable may include a flat and flexible plastic film base, with multiple flat metallic conductors bonded to one surface. Each end of the cable may be reinforced with a stiffener to make insertion easier or to provide strain relief. The FFC 506 may be used in place of round cables for easy cable management. The FFC 506 may take up less space than round cables and may offer better electromagnetic interference (EMI) and radiofrequency interference (RFI)

suppression while eliminating wire-coupling issues. In addition, because the wires of the FFC 506 may be protected individually and not wrapped many times over by different materials as round cables are, the FFC 506 may be lighter in weight and offer greater flexibility than conventional cables.

The first connector 504 and the second connector 510 may be conventional pin connectors (e.g., 30 pins) that allow for the first type of connector assembly 502 to be physically and electrically coupled to other devices. For example, the first connector 504 may attach to one or more components on a PCB. The second connector 510 may attach to one or more components on the sub-assembly 402.

The FFC 506 and the first connector 504 may be attached to the base 102 via an adhesive 508 dispensed around the perimeter of the connector opening 108. The adhesive 508 may be a conventional type of adhesive, such as an epoxy or a silicone adhesive (e.g., a room-temperature-vulcanizing (RTV) silicone). The adhesive 508 may secure the FFC 506 to the base 102 and the first connector 504 within the connector opening 108. In an example, the adhesive 508, FFC 506, and the first connector 504 may create a hermetic and air-tight seal around the connector opening 108.

The first type of connector assembly 502 may allow for the sub-assembly 402 to be electrically coupled to an external device while remaining isolated from any type of physical forces subjected to the first connector 504.

Figure 6:
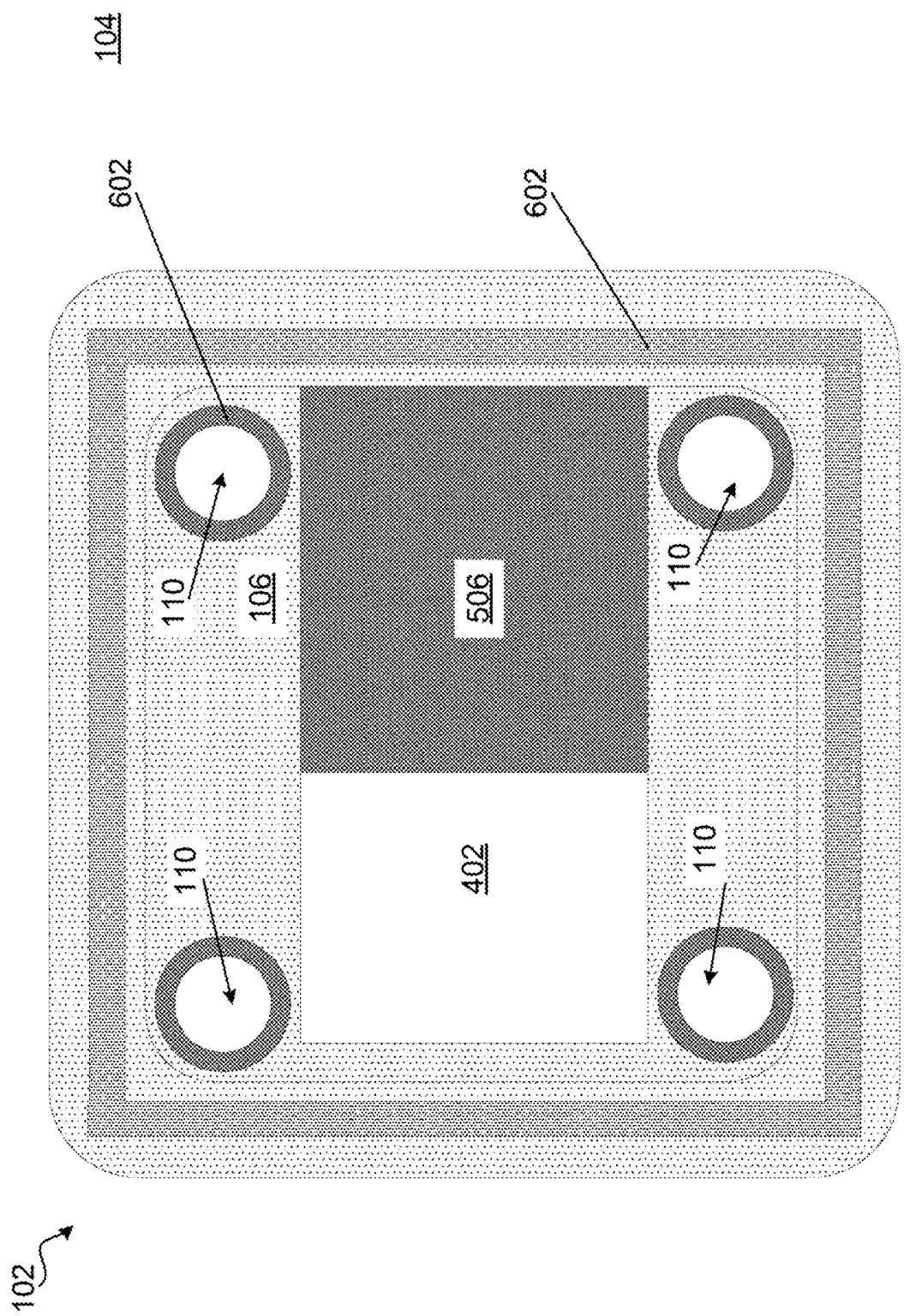
FIG. 6 is a top-view of the base illustrating the deposition of an adhesive.

Referring now to FIG. 6, a top-view of the base 102 illustrating the deposition of an adhesive 602 is shown. The adhesive 602 may be a conventional type of adhesive, preferably with a low curing temperature and low modulus. The adhesive 602 may have a coefficient of thermal expansion (CTE) that is close to the CTE of the base 102 and a lid 702 to avoid any CTE mismatch and in order to reduce stress on the package. Examples of commercially available adhesives that may be used for the adhesive include "EP21TDC-2LO" manufactured by MasterBond® and "SEMICOSIL 988" manufactured by Wacker®. The adhesive 602 may be deposited on the rim 104 and around one or more of the one or more screw openings 110.

Figure 7:
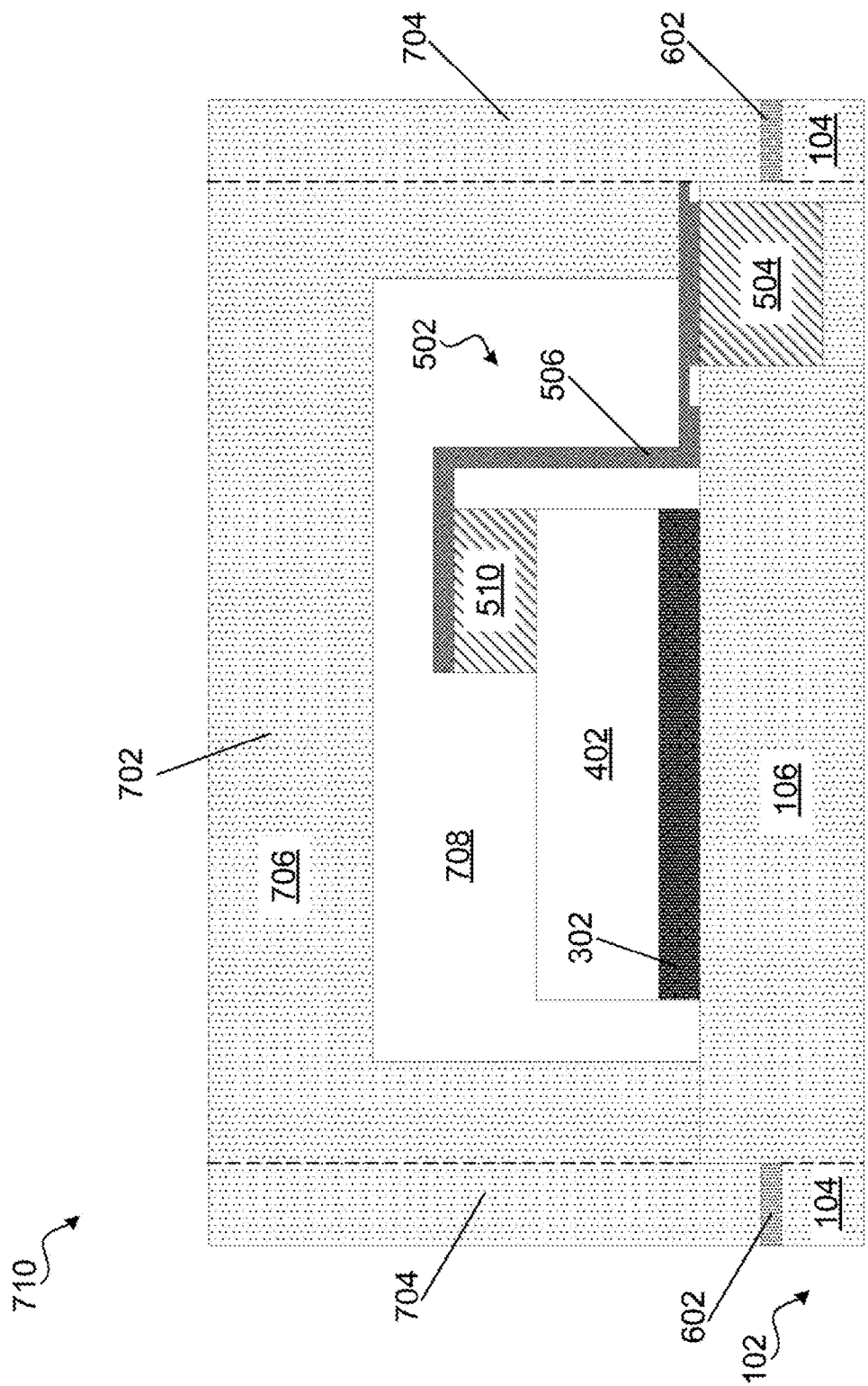
FIG. 7 is a cross-sectional view illustrating attaching a lid to the base to form a package.

Referring now to FIG. 7, a cross-sectional view illustrating attaching a lid 702 to the base 102 to form a package 710 is shown. The lid 702 may be formed using one or more materials, including metal, ceramic, or a polymer such as a plastic. For applications in which it is desirable for the lid 702 to provide RF shielding and/or to transmit electrical signals, the lid 702 be formed of metal, or can be formed of ceramic or plastic with a conductive layer. In an example, the lid 702 may be formed from a pre-molded plastic (e.g., with leadframes).

The lid 702 may be designed such that it complements the shape of the base 102. For example, the lid 702 may include a first portion 706 that extends to an upper surface of the platform 106 and a second portion 704 that extends to an upper surface of the rim 104. The lid 702 may be secured to the base 102 via the adhesive 602. The adhesive 602 may secure the lid 702 to the base 102 and may create a hermetic and air-tight seal around the rim 104 and the one or more screw openings 110. The air-tight seal may form a cavity 708 within the package 710. The cavity 708 may insulate the sub-assembly 402 and may provide thermal resistance to minimize thermal conduction across the package 710 and into/out of the package 710.

Figure 8:
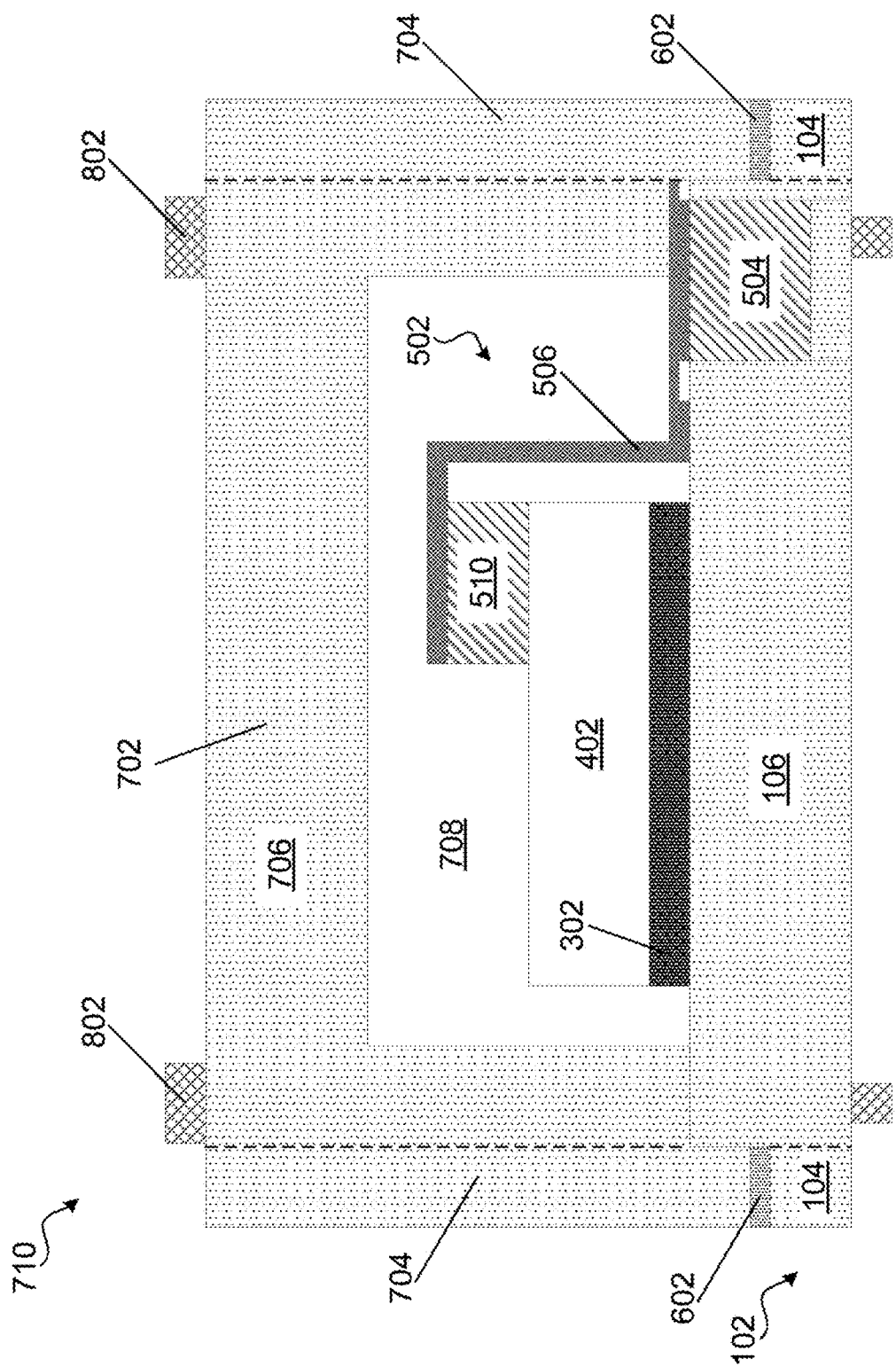
FIG. 8 is a cross-sectional view illustrating one or more screws inserted through one or more screw openings.

Referring now to FIG. 8, a cross-sectional view illustrating one or more screws 802 inserted through the one or more screw openings 110. As described below with reference to FIG. 16, the lid 702 may include one or more screw openings 1602 that correspond to and align with the one or more screw openings 110 in the base 102. The one or more screws 802 may extend through an entire thickness of the package 710 and may be used to fasten the package 710 to another device (e.g., a PCB).

Figure 9:
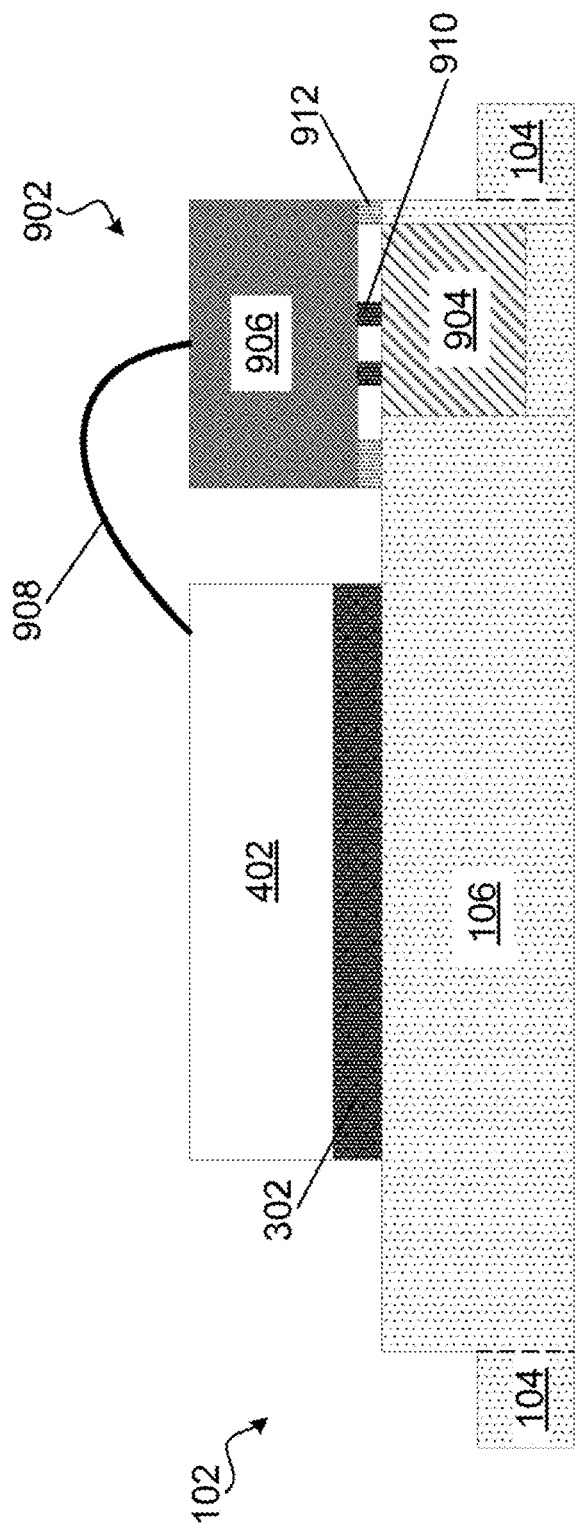
FIG. 9 is a cross-sectional view illustrating forming a second type connector assembly.

Referring now to FIG. 9, a cross-sectional view illustrating forming a second type connector assembly 902 is shown. The second type connector assembly 902 shown in FIG. 9 may be an alternative to the of first type of connector assembly 502 shown in FIG. 5 and may incorporate all of the steps described above with reference to FIGS. 1-4. The second type connector assembly 902 may include a connector 904, an interposer 906, and wire bond 908. The connector 904 may be conventional pin connectors (e.g., 30 pins) that allow for the second type connector assembly 902 to be physically and electrically coupled to other devices.

The connector 904 may be electrically coupled to the interposer 906 by one or more solder points 910. The interposer 906 may be one of a rigid or flexible interposer and may be composed of one or more of a glass-reinforced epoxy laminate material (e.g., FR4) and polyimide. In other examples, the interposer 906 may be composed of silicon and/or glass. The interposer 906 may include or more vias (not shown) formed from a conductive material, such as metal or metal alloy. The one or more vias, may carry electrical signals between the wire bond 908 and the connector 904 through the interposer 906. The connector may be attached to the lid using an adhesive 912 deposited around the connector opening 108. In an example, the adhesive 912 may be similar to the adhesive 602 described above. The adhesive 912 may assist in securing the interposer 906 to the connector 904 and securing the connector 904 in the connector opening 108. The adhesive 912 may create a hermetic and air-tight seal around the connector opening 108.

The wire bond 908 may be connected to the one or more vias in the interposer 906. The wire bond 908 may be composed of conductive material, such as a metal or metal alloy. The wire bond 908 may also be connected to a bonding pad formed on the sub-assembly 402. The second type connector assembly 902 may allow for the sub-assembly 402 to be electrically coupled to an external device while remaining isolated from any type of physical forces subjected to the connector 904.

Figure 10:
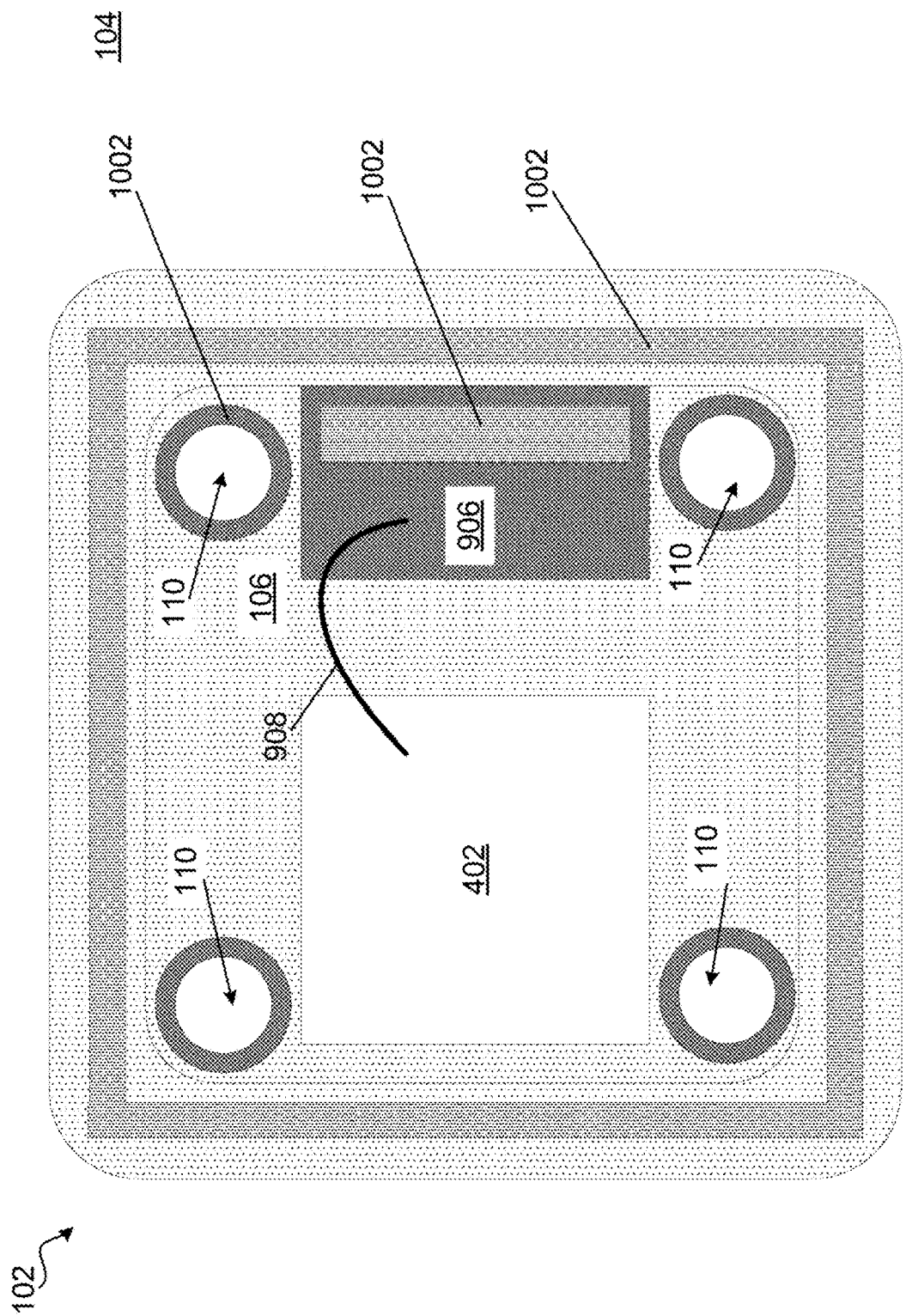
FIG. 10 is a top-view of the base illustrating the deposition of an adhesive.

Referring now to FIG. 10, a top-view of the base 102 illustrating the deposition of an adhesive 1002 is shown. In an example, the adhesive 1002 may be similar to the adhesive 602 described above. The adhesive 1002 may be deposited on the interposer 906, the rim, 104 and around one or more of the one or more screw openings 110.

Figure 11:
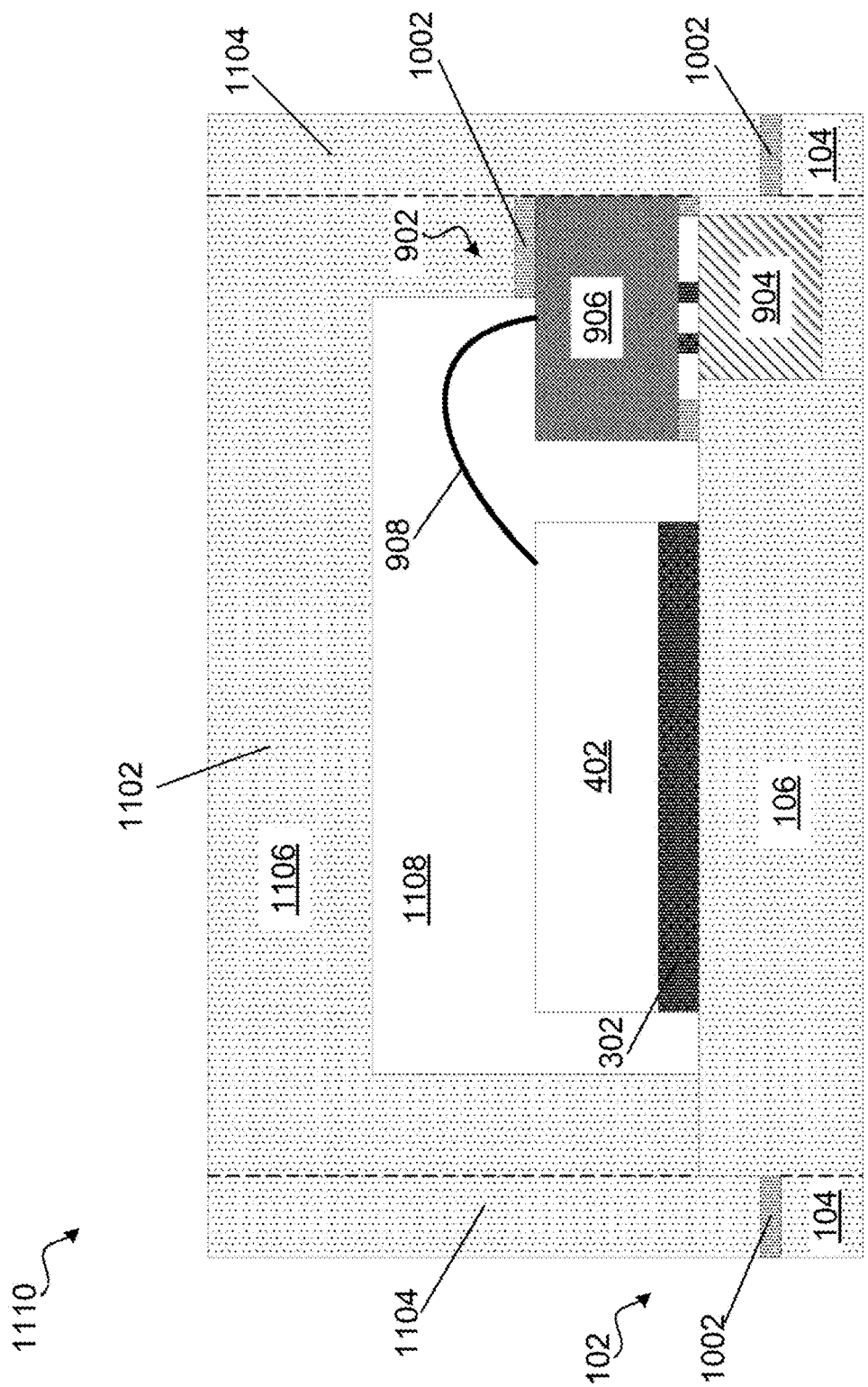
FIG. 11 is a cross-sectional view illustrating attaching a lid to the base to form a package.

Referring now to FIG. 11, a cross-sectional view illustrating attaching a lid 1102 to the base 102 to form a package 1110 is shown. The lid 1102 may be formed using one or more materials, including metal, ceramic, or a polymer such as a plastic. For applications in which it is desirable for the lid 1102 to provide RF shielding and/or to transmit electrical signals, the lid 1102 be formed of metal, or can be formed of ceramic or plastic with a conductive layer. In an example, the lid 1102 may be formed from a pre-molded plastic (e.g., with leadframes).

The lid 1102 may be designed such that it complements the shape of the base 102. For example, the lid 1102 may include a first portion 1106 that extends to an upper surface of the platform 106 and an upper surface of the interposer 906 and a second portion 1104 that extends to an upper surface of the rim 104. The lid 1102 may be secured to the base 102 and the interposer 906 via the adhesive 1002. The adhesive 1002 may secure the lid 1102 to the base 102 and may create a hermetic and air-tight seal around the rim 104 and the one or more screw openings 110. The air-tight seal may form a cavity 1108 within the package 710. The cavity 1108 may insulate the sub-assembly 402 and may provide thermal resistance to minimize thermal conduction across the package 1110 and into/out of the package 1110.

Figure 12:
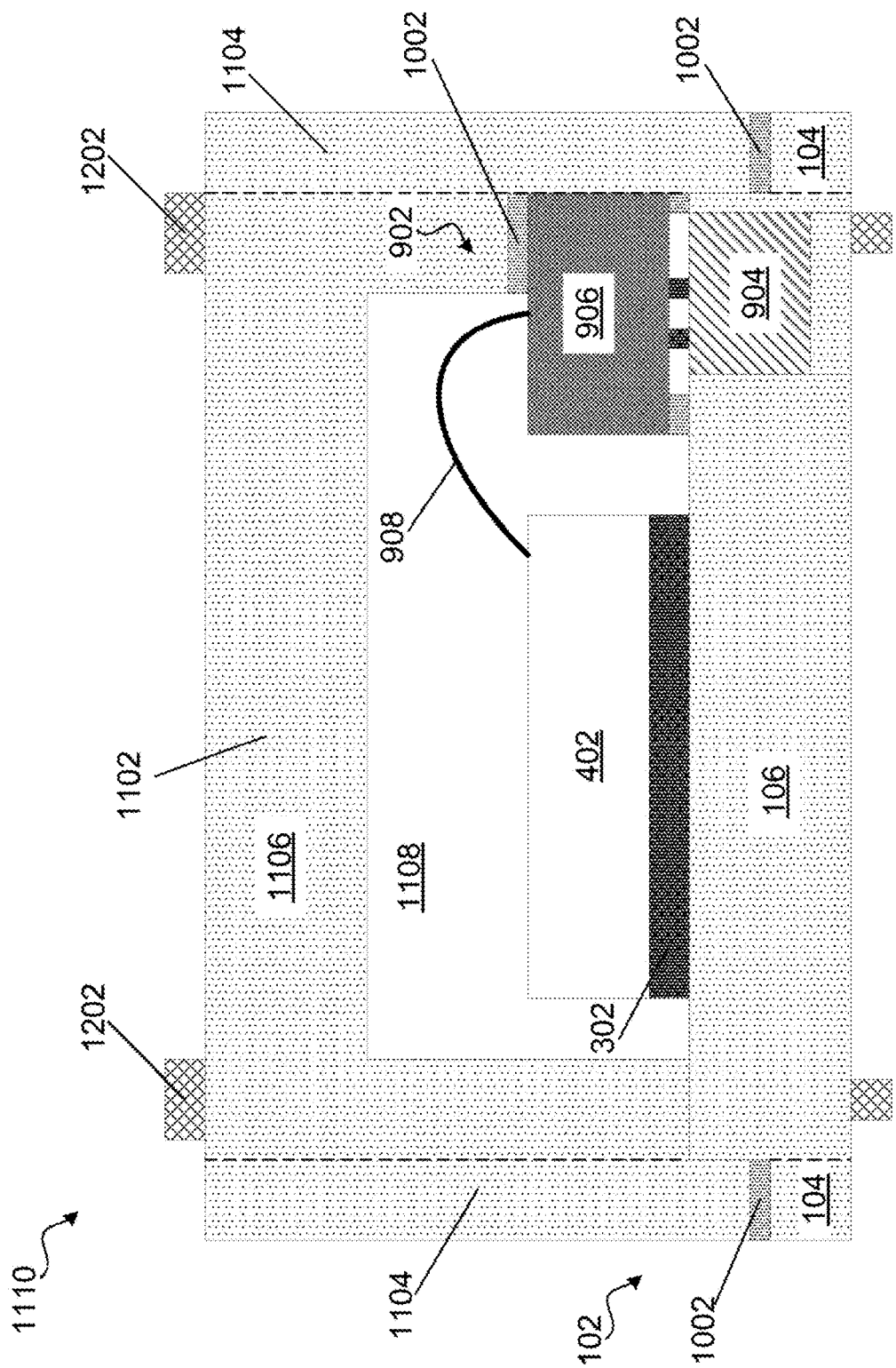
FIG. 12 is a cross-sectional view illustrating one or more screws inserted through the one or more screw openings.

Referring now to FIG. 12, a cross-sectional view illustrating one or more screws 1202 inserted through the one or more screw openings 110. As described below with reference to FIG. 16, the lid 1102 may include one or more screw openings 1602 that correspond to and align with the one or more screw openings 110 in the base 102. The one or more screws 1202 may extend through an entire thickness of the package 1110 and may be used to fasten the package 1110 to another device (e.g., a PCB).

Figure 13:
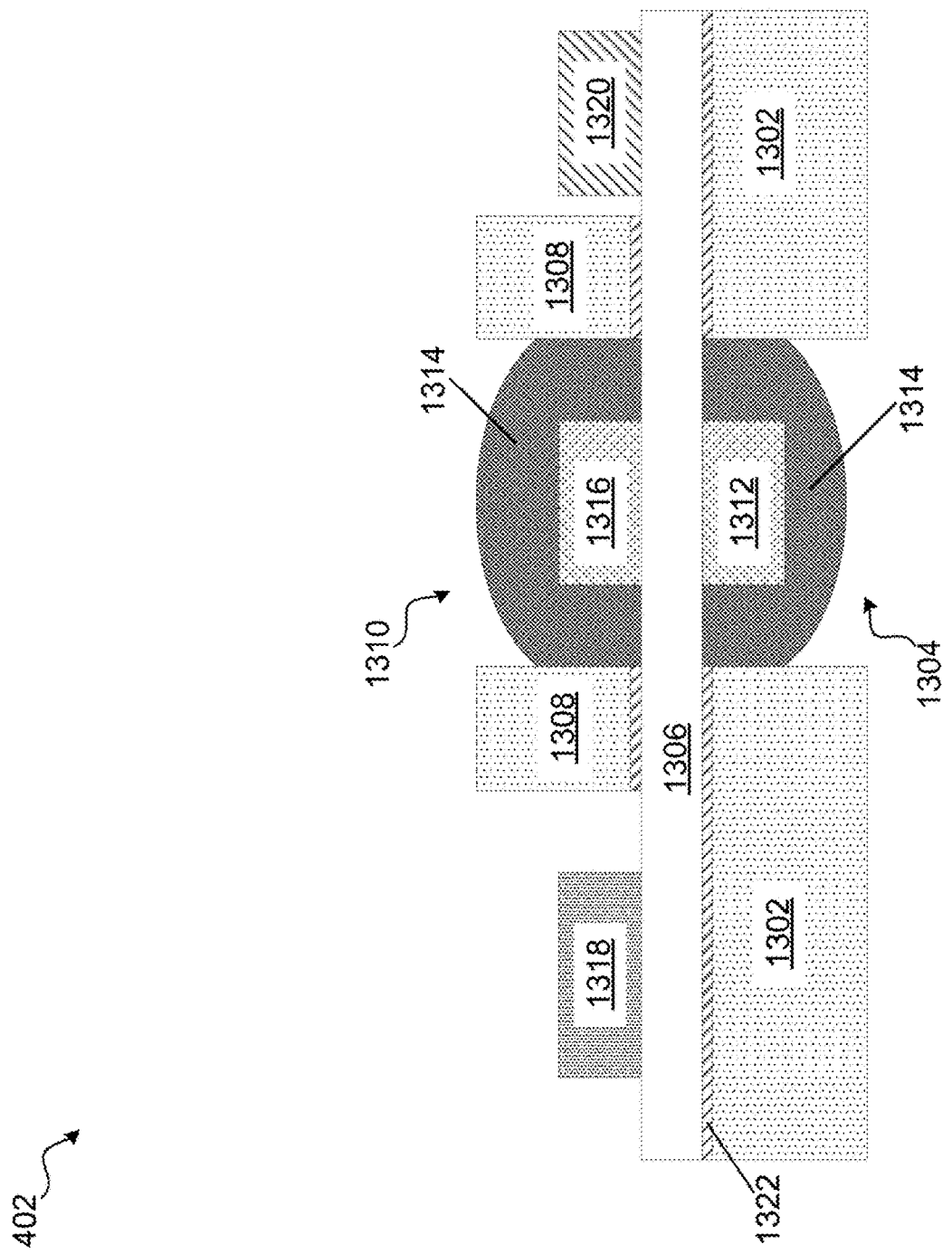
FIG. 13 is a cross-sectional view illustrating an example sub-assembly.

Referring now to FIG. 13, a cross-sectional view illustrating an example sub-assembly 402 is shown. In an example, the sub-assembly 402 shown in FIG. 13 may be used along with the first type of connector assembly 502 described above. The sub-assembly 402 may include a first laminate layer 1302 that is attached to the elastomer pad 302. The first laminate layer 1302 may be composed of a thermally and/or electrically insulating material such as a glass-reinforced epoxy laminate material (e.g., FR4). In an example, the first laminate layer 1302 may be a ring and may include a first opening 1304.

In an example, the first laminate layer 1302 may be attached to a bottom surface of a substrate 1306 by a solder reflow process using surface mount technology (SMT). In another example, the first laminate layer 1302 may be attached to the bottom surface of the substrate 1306 using a conventional type of adhesive 1322. The adhesive 1322 may have a low curing temperature and low modulus and may be similar to the adhesive 602 described above. The substrate 1306 may be composed of one or more of a semiconductor material (e.g., silicon), a printed circuited board (PCB) and a thermally and/or electrically insulating material such as an glass-reinforced epoxy laminate material (e.g., FR4). In an example, the substrate 1306 may be composed of the same material as the first laminate layer 1302 to reduce or eliminate any CTE mismatch between the two layers.

The substrate 1306 may include a first copper layer on the bottom surface and a second copper layer on a top surface, resulting in a two layer substrate 1306 with coarse/relaxed design rules for copper trace/width. The substrate 1306 may also include one or more pin through hole (PTH) vias that electrically connect the bottom surface and the top surface. This arrangement may allow for SMT operation and connection of various components to either side of the substrate 1306 through one or more copper pad terminals.

A second laminate layer 1308 may be attached to the top surface of the substrate 1306. In an example, a second laminate layer 1308 may be attached to the top surface of the substrate 1306 by a solder reflow process using SMT. In another example, the second laminate layer 1308 may be attached to the top surface of the substrate 1306 using the adhesive 1322. The second laminate layer 1308 may be composed of a thermally and/or electrically insulating material such as a glass-reinforced epoxy laminate material (e.g., FR4). The second laminate layer 1308 may be a ring and may include a second opening 1310.

One or more MEMS devices may be attached to the substrate 1306 via the one or more SMT connections. In an example, a first IMU 1312 may be attached to the bottom surface on the substrate 1306 in the first opening 1304. The first IMU 1312 may be attached to the substrate 1306 using a conventional SMT technique. For example, a solder paste may be printed onto the bottom surface of the substrate 1306, the first IMU 1312 may be positioned onto the solder stencil via a pick and place technique, and a reflow, de-flux, and baking process may be performed. In an example, the first IMU 1312 may be attached to the substrate 1306 via a land grid array (LGA) pin.

A second IMU 1316 may be attached to the upper surface on the substrate 1306 in the second opening 1310. The second IMU 1316 may also be attached to the substrate 1306 using a conventional SMT technique. For example, a solder paste may be printed onto the top surface of the substrate 1306, the second IMU 1316 may be positioned onto the solder stencil via a pick and place technique, and a reflow, de-flux, and baking process may be performed. In an example, the second IMU 1316 may be attached to the substrate 1306 via a land grid array (LGA) pin.

After the first IMU 1312 and the second IMU 1316 are attached to the substrate 1306, a thermally conductive paste ("TCP") 1314 may be deposited in the first opening 1304 and the second opening 1310, such that it completely surrounds the first IMU 1312 and the second IMU 1316. The TCP 1314 may minimize temperature gradients across the first IMU 1312 and the second IMU 1316 by spreading heat uniformly. A constant volume of the TCP 1314 on the first IMU 1312 and the second IMU 1316 may result in reduction/elimination of thermal gradients along the X, Y, and Z-axes. The TCP 1314, along with the confined volume of the first opening 1304 and the second opening 1310, may help stabilize temperature in response to thermal energy fluctuations. This may significantly improve device performance.

The type of TCP 1314 used may be chosen based on one or more characteristics, such as: dispensability and flow, the ability to fill gaps, conformal coverage around the first IMU 1312 and the second IMU 1316 (e.g., void-free without entrapped air pockets), cure time (e.g., less than one hour) and cure temperature (e.g., less than 100° C.), thermal conductivity (e.g., greater than 2 W/m·K), low modulus and low shrinkage (shore-A hardness), adhesion to FR4, stable properties at different temperature ranges (e.g., −40° C. to 85° C.), resistance to hardening at higher temperatures, and stability when subjected to shock and/or vibration.

The TCP 1314 may be silicone based and composed of either a one-part material or a two-part material. The TCP 1314 may include, for example, conventional products commercially available from DOW®, Laird®, LORD®, ShinEtsu®, and Wacker®. The TCP 314 may be deposited, and optionally, cured according to manufacture recommendations.

In an example, optionally the sub-assembly 402 may also include a micro-controller (MCU) 1318. The MCU 1318 may be attached to the substrate 1306 using a conventional SMT technique, such as those described above. The MCU 1318 may be attached to the substrate 1306 by, for example, a quad-flat no-leads (QFN) pin.

The sub-assembly 402 may also include a connector 1320. The connector 1320 may be attached to the substrate 1306 using a conventional SMT technique, such as those described above. The connector 1320 may be a flexible connector and may serve as an attachment point for the second connector 510 of the first type of connector assembly 502 described above.

Figure 14:
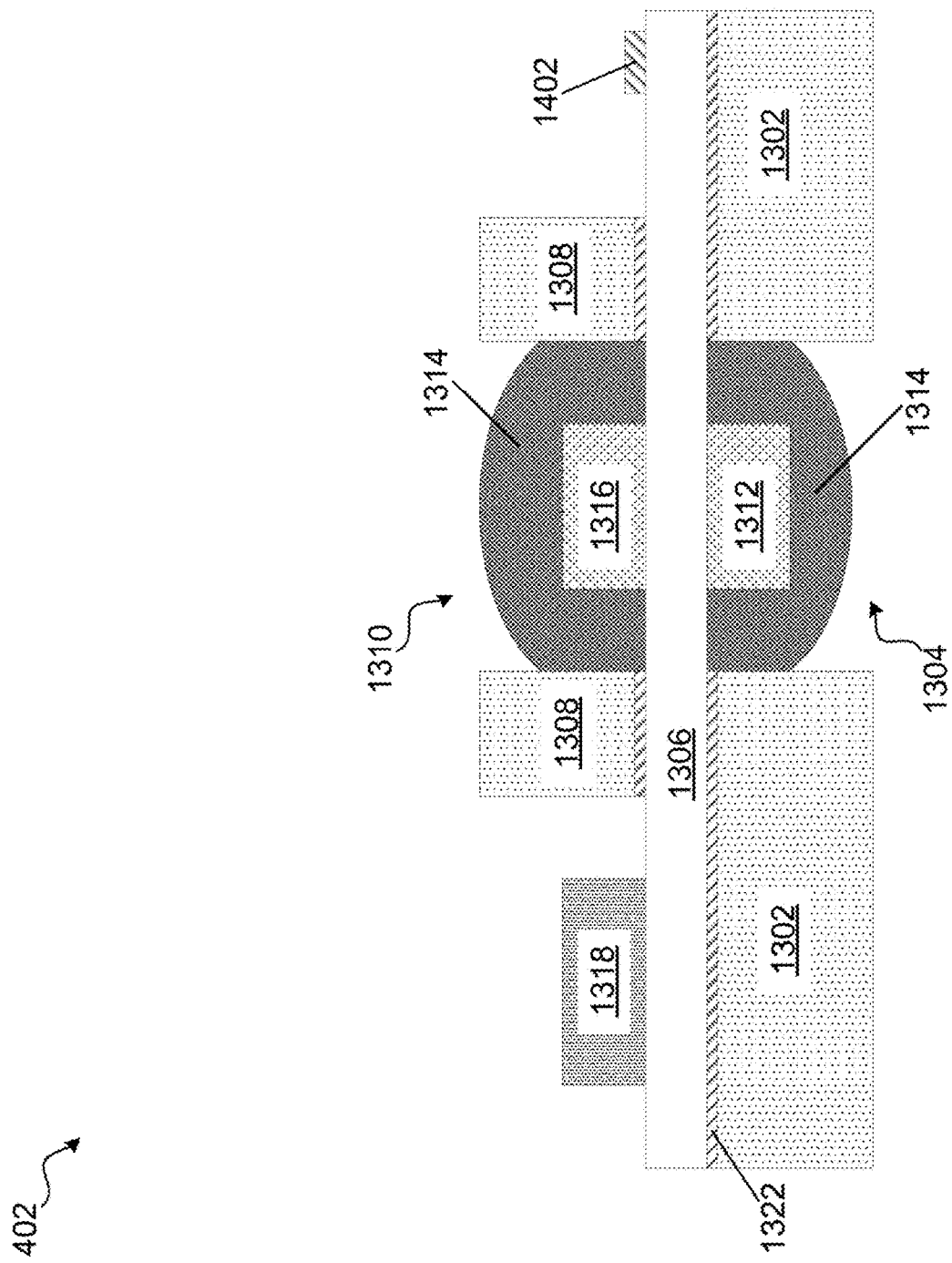
FIG. 14 is a cross-sectional view illustrating another example sub-assembly.

Referring now to FIG. 14, a cross-sectional view illustrating another example sub-assembly 402 is shown. In an example, the sub-assembly 402 shown in FIG. 14 may be used along with the second type connector assembly 902 described above.

The sub-assembly 402 shown in FIG. 14 may be substantially similar to the sub-assembly 402 shown in FIG. 13. However, instead of a connector 1320, the sub-assembly 402 may include a wire bond pad 1402 for the attachment of the wire bond 908. The wire bond pad 1402 may be formed on the upper surface of the substrate 1306.

Although the examples of the sub-assembly shown in FIGS. 13 and 14 include two IMUs, the sub-assembly 402 may include any number of IMUs and/or other devices and still be consistent with the scope of this disclosure. For example, it is contemplated that the sub-assembly 402 contain one IMU, which may be connected to either the upper surface or the bottom surface of the substrate 1306. If the sub-assembly 402 contains one IMU (or any other number of IMUs) and other devices that are located on the upper surface of the substrate 1306, the sub-assembly may not include the first laminate layer 1302 and the substrate 1306 may be directly attached to the elastomer pad 302.

Figure 15:
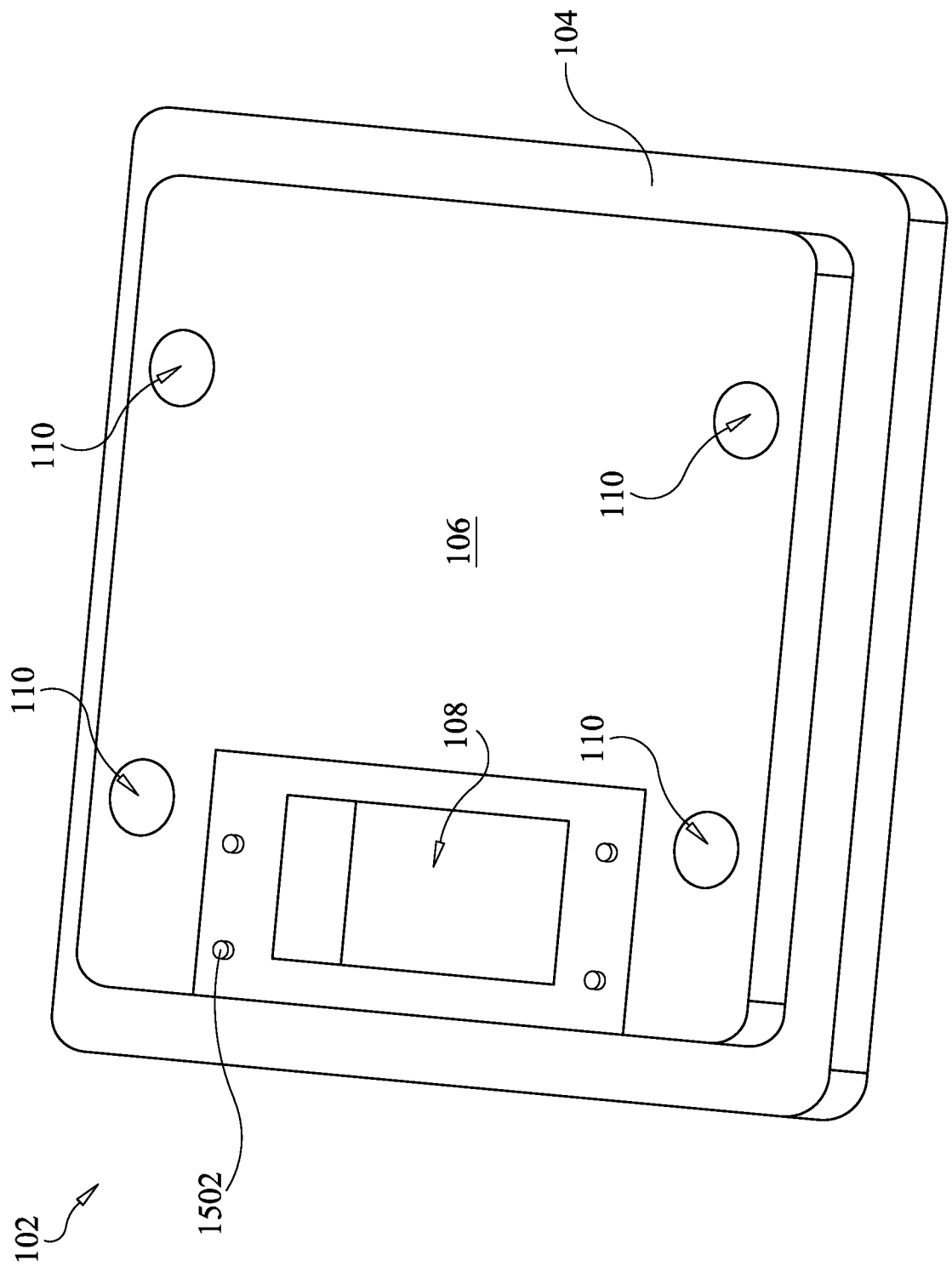
FIG. 15 is a three-dimensional perspective view of the base.

Referring now to FIG. 15, a three-dimensional perspective view of the base 102 is shown. As described above, the base 102 may include the rim 104, the platform 106, the connector opening 108, and the one or more screw openings 110. The platform 106 has a greater height than the rim 104, which allows for a hermetic and air-tight seal once the lid 702 is attached. In an example, the area of the platform 106 surrounding the connector opening 108 may include one or more guide pins 1502 to assist in the attachment of the first connector 504 and/or the FFC 506.

Figure 16:
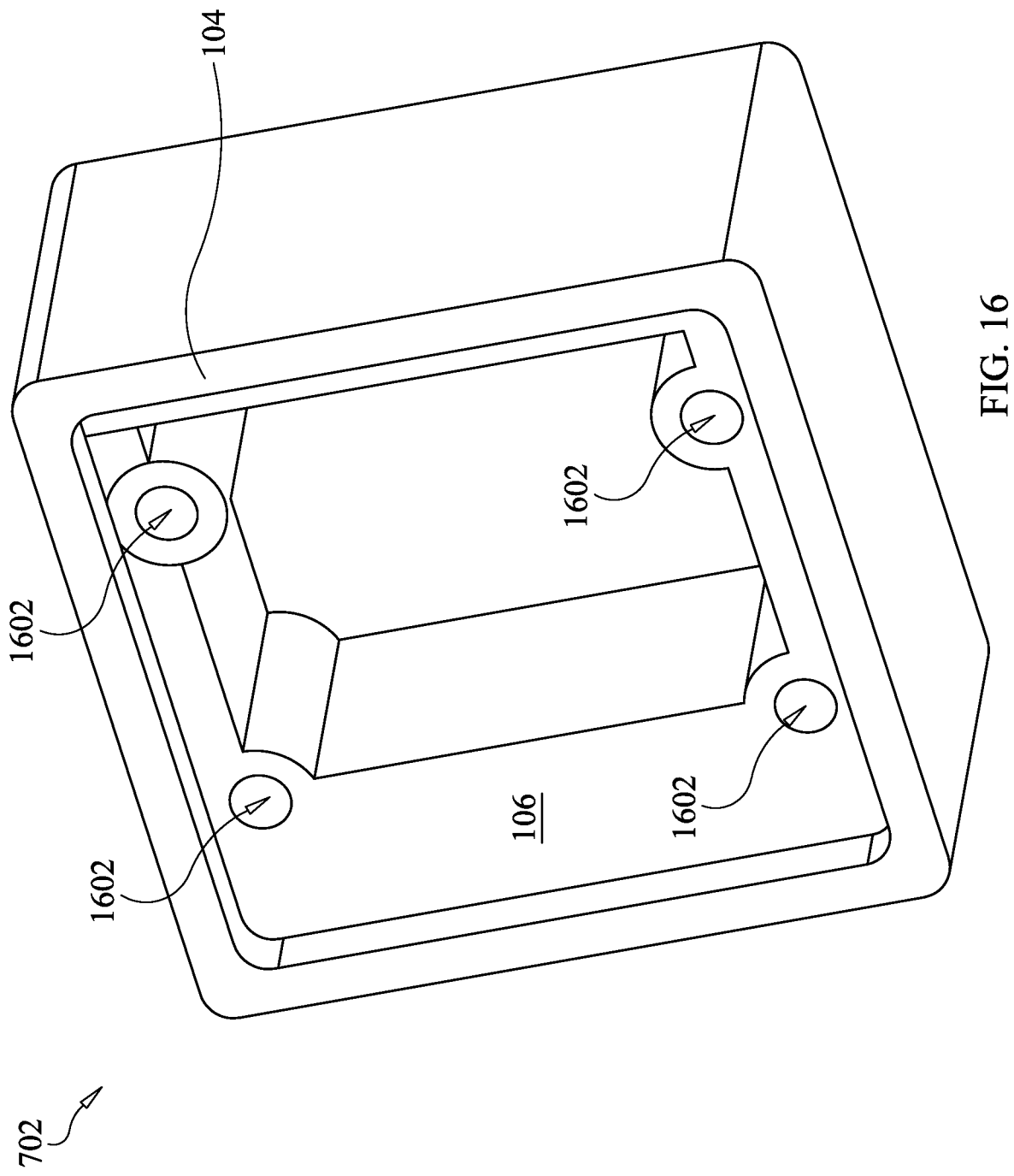
FIG. 16 is a three-dimensional perspective view of the lid.

Referring now to FIG. 16, a three-dimensional perspective view of the lid 702 is shown. As describe above, the lid 702 has 702 may include the first portion 706 that extends to an upper surface of the platform 106 and the second portion 704 that extends to an upper surface of the rim 104. The lid 702 may have one or more screw openings 1602 that correspond with the one or more screw openings 110 in the base 102. Although the lid 702 used in connection with the first type of connector assembly 502 is shown, it should be noted that the lid 1102 used with the second type of connector assembly 902 is substantially similar and has similar features, including the one or more screw openings 1602.

Figure 17:
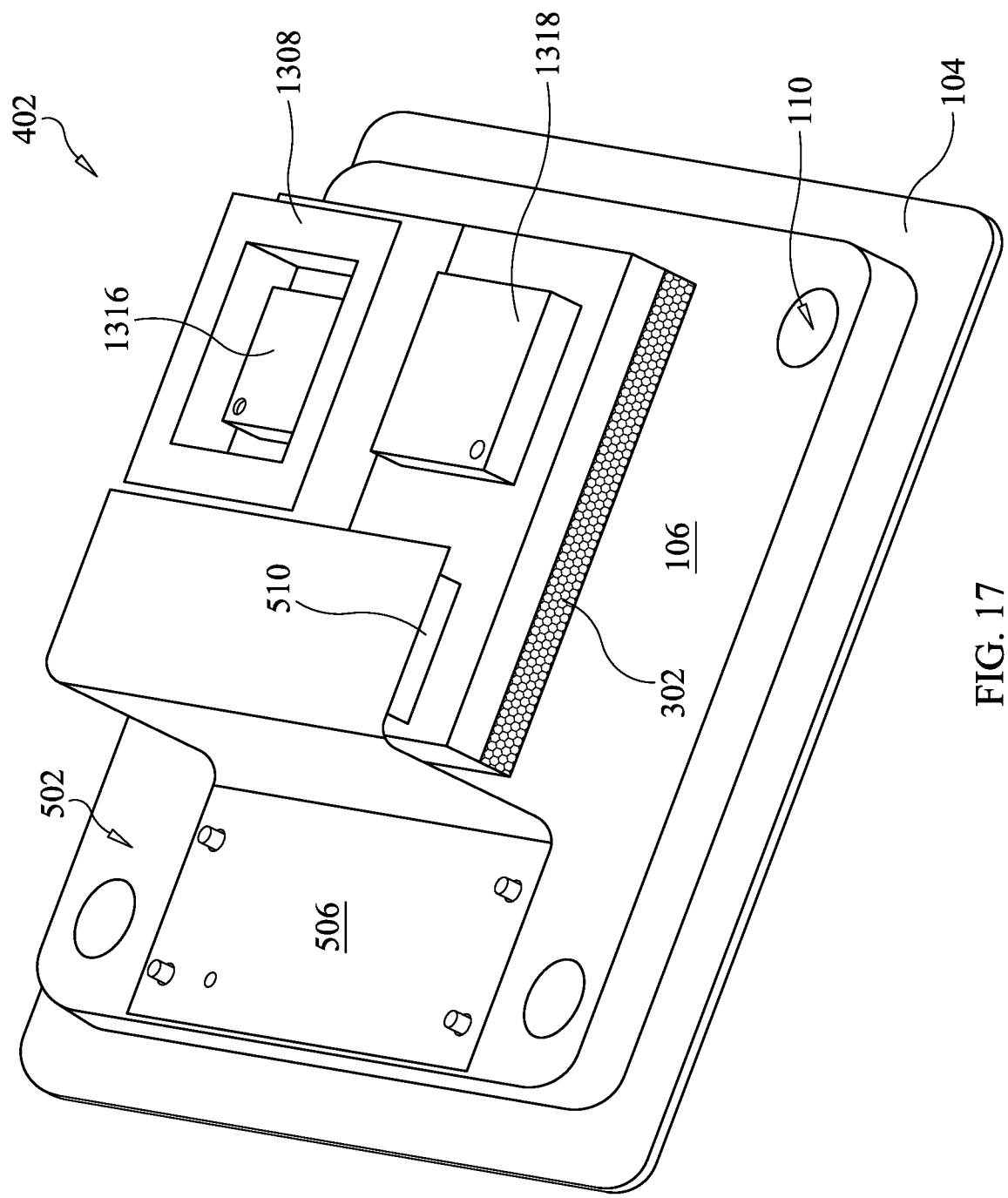
FIG. 17 is a three-dimensional perspective view of the first type of connector assembly.

Referring now to FIG. 17, a three-dimensional perspective view of the first type of connector assembly 502, the elastomer pad 302, and the sub-assembly 402 is shown. As described above, the FFC 506 may be attached to the platform 106 portion of the base 102 via the adhesive 508. The FFC 506 may electrical couple the first connector 504 in the connector opening 108 with the second connector 510, which is attached to the sub-assembly 402 via the second connector 510. The sub-assembly 402 may be attached to the elastomer pad 302, which is formed on the platform 106 portion of the base 102. In this example, the sub-assembly 402 includes, at least, the MCU 1318, the second IMU 1316, and the second laminate layer 1308.

Figure 18:
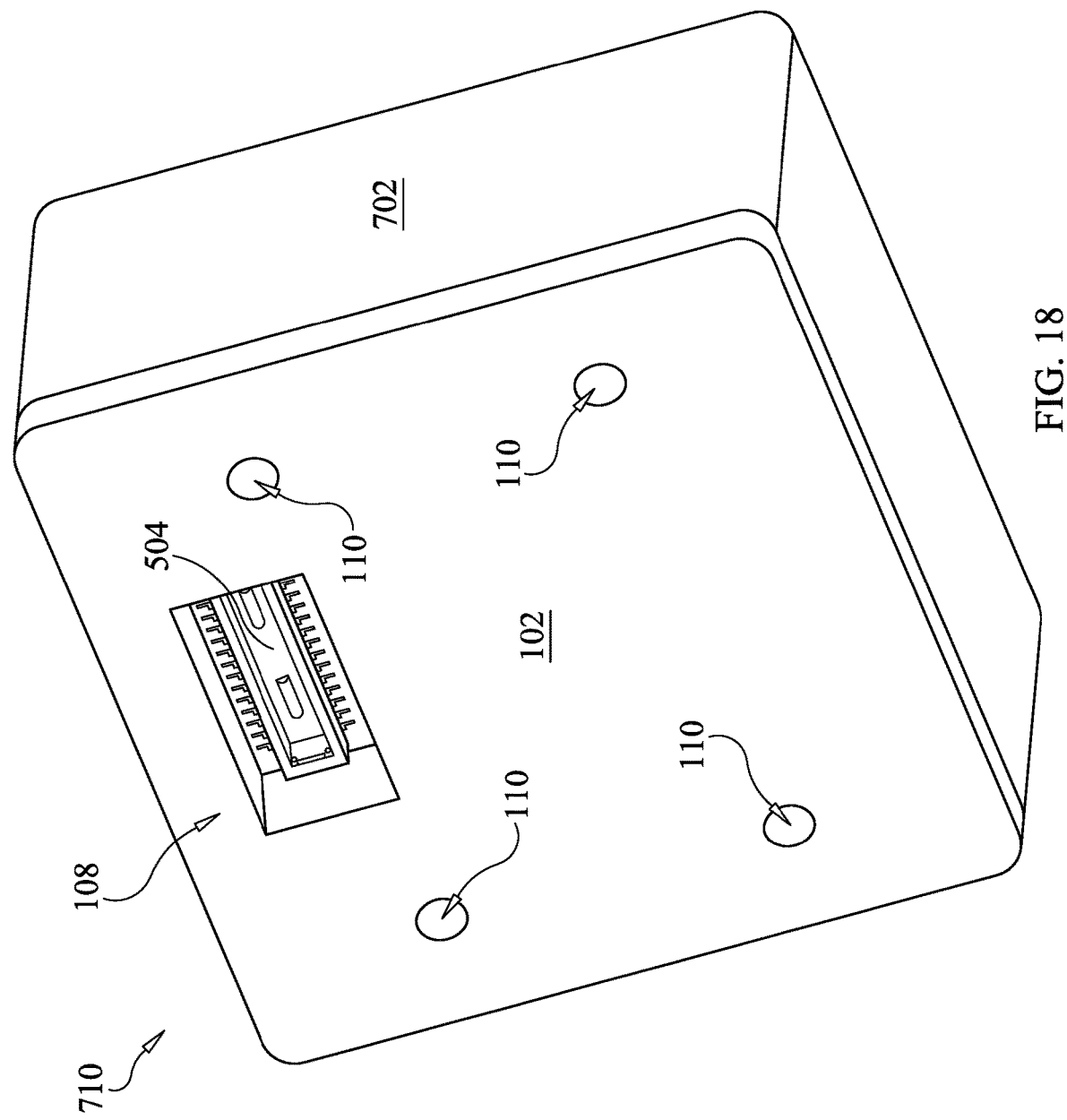
FIG. 18 is a three-dimensional perspective view of the underside of the package.

Referring now to FIG. 18, a three-dimensional perspective view of the underside of the package 710 is shown. It should be noted that package 1110, which differs from the package 710 in the use of the interposer 906 and wire bond 908 for the second type connector assembly 902, may look substantially similar to the package 710. As described above, the lid 702 may be attached to the base by the adhesive 602. The base 102 may have one or more screw openings 110 that may be used to affix the package 710 to another device. The base 102 may also include the connector opening 108 and the first connector 504 mounted inside. The first connector 504 may be exposed, but it forms a hermetic and air-tight seal with the connector opening 108.

Figure 19:
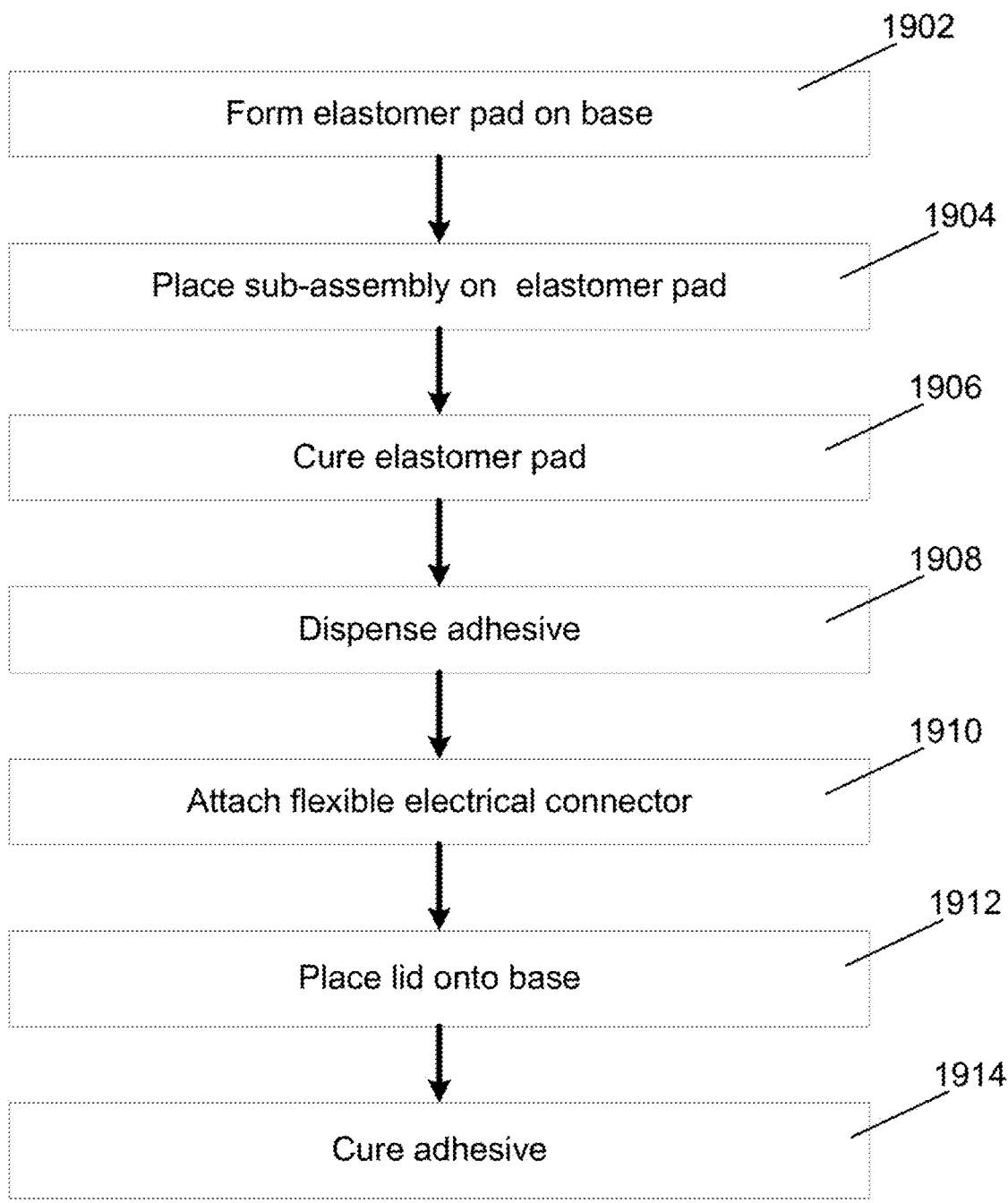
FIG. 19 is a flowchart illustrating an example process of forming the package.

Referring now to FIG. 19, a flowchart illustrating an example process of forming the package 710 and the package 1110 is shown. In step 1902, the elastomer pad 302 may be formed on the platform 106 portion of the base 102. In step 1904, the sub-assembly 402 may be formed on the elastomer pad 302. In an example, the sub-assembly 402 may be formed separately and placed om the elastomer pad 302 via a pick and place technique. In step 1906 the elastomer pad 302 may be allowed to cure.

In step 1908, adhesive may be dispensed onto the base 102. In examples where the first type of connector assembly 502 is used, the adhesive 508 may be dispensed around the connector opening 108 and the adhesive 602 may be dispensed around the one or more screw openings 110 and on the rim 104. In examples where the second type connector assembly 902 is used, the adhesive 912 may be dispensed around the connector opening 108 and the adhesive 1002 may be dispensed around the one or more screw openings 110 and on the rim 104.

In step 1910, the flexible electrical connector may be attached. In examples where the first type of connector assembly 502 is used, the first connector 504 may be inserted into the connector opening 108 and the FFC 506 may be attached to the base 102 via the adhesive 602. The adhesive 602 may secure the FFC 506 to the base 102 and the first connector 504 within the connector opening 108, thereby creating a hermetic and air-tight seal. The FFC 506 may then be attached to the sub-assembly 402 via the second connector 510. In examples where the second type connector assembly 902 is used, the connector 904 may be inserted into the connector opening 108. The interposer 906 may be attached to the connector 904 via one or more solder points 910. The interposer 906 may be attached to the lid via the adhesive 912, which may secure the connector 904 in the connector opening 108 and may create an air-tight seal. A wire bond 908 may be attached to a bonding pad on the interposer and a bonding pad on the sub-assembly.

In step 1912, the lid may be placed on the base. In examples where the first type of connector assembly 502 is used, the lid 702 may be secured by the adhesive 602 dispensed around the one or more screw openings 110 and on the rim 104. In examples where the second type connector assembly 902 is used the lid 1102 may be secured by the adhesive 1002 dispensed around the one or more screw openings 110, on the rim 104, and on the interposer 906. In step 1914, the adhesive may be cured, thereby creating an air-tight seal.

Figure 20:
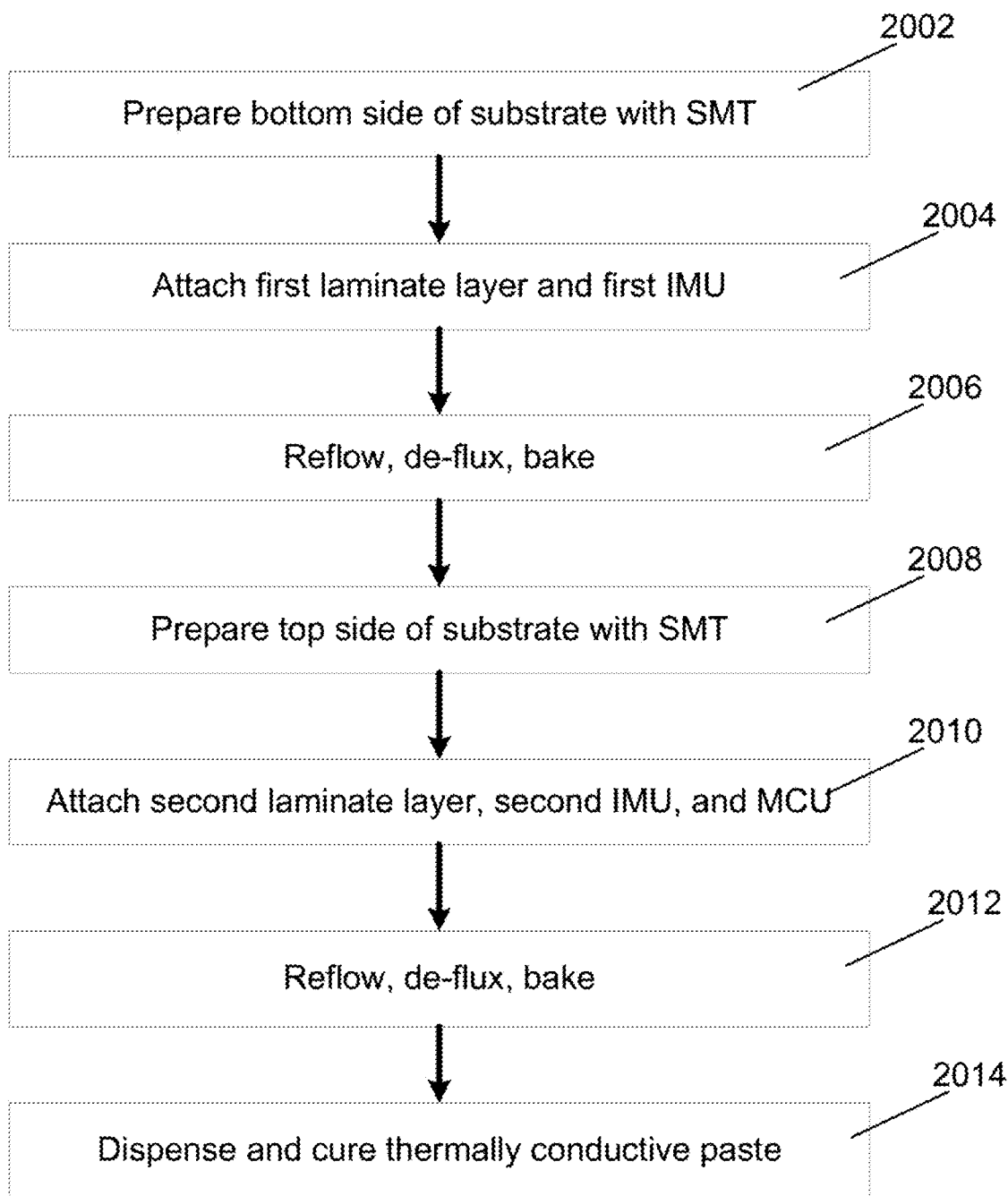
FIG. 20 is a flowchart illustrating an example process of forming the sub-assembly.
Figure 21:
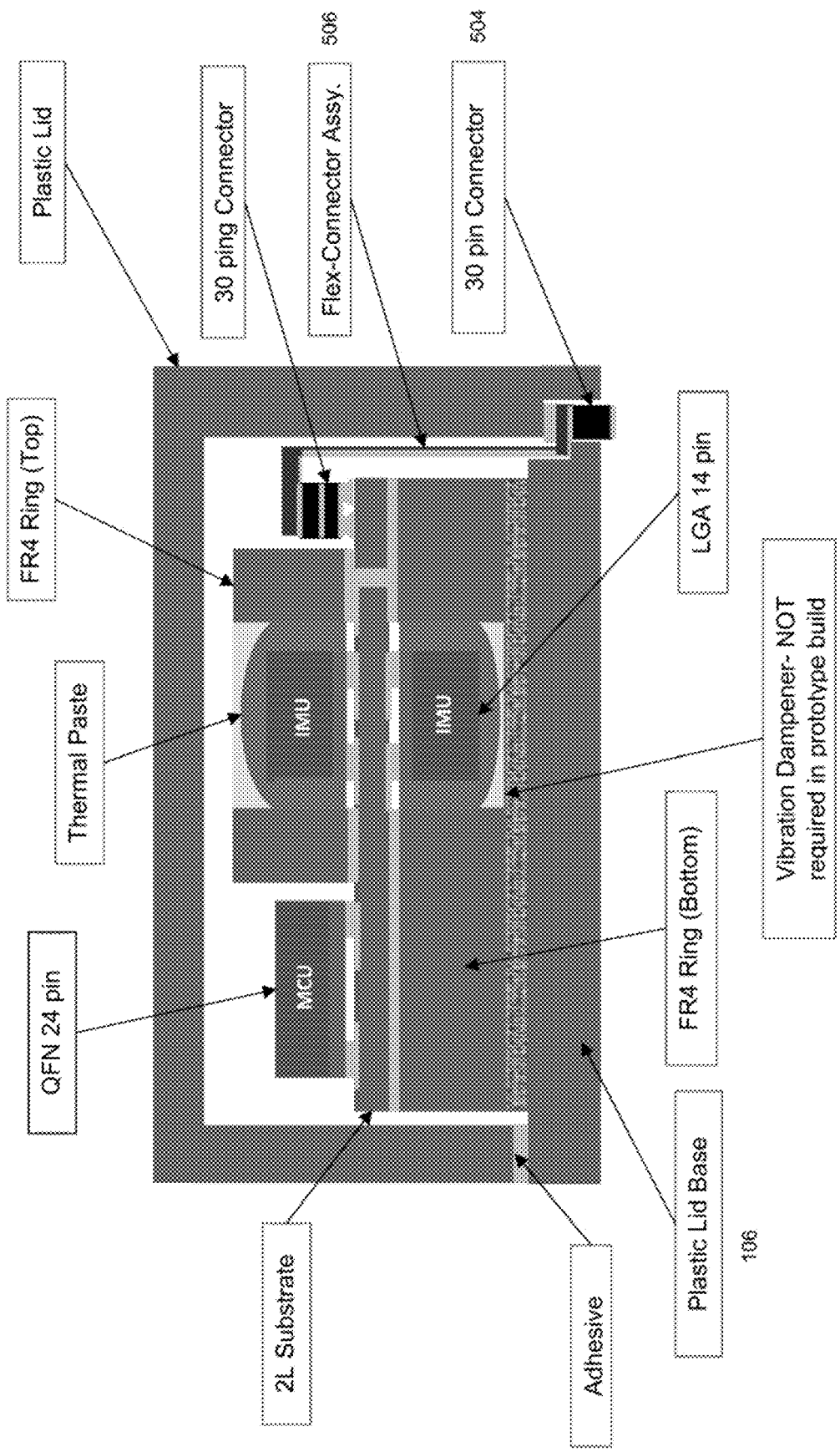
FIG. 21 is a cross-sectional view of the package.

Referring now to FIG. 20, a flowchart illustrating an example process of forming the sub-assembly 402 is shown. In step 2002, the bottom side of the substrate 1306 may be prepared for SMT. This may include dispensing solder paste in a predetermined pattern using conventional techniques, such as stencil or printing. In step 2004, the first laminate layer 1302 may be attached to the bottom side of the substrate 1306 to form the first opening 1304. The first IMU 1312 may be attached to the bottom side of the substrate 1306 within the first opening 1304. In step 2006, a reflow, deflux, and baking process may be performed to secure the first laminate layer 1302 and the first IMU 1312. FIG. 21 is a cross-sectional view of the package. As shown in FIG. 21, the connection point between connector 504 and cable 506 is hermetically sealed inside base 106.

In step 2008, the top side of the substrate 1306 may be prepared for SMT. This may include dispensing solder paste in a predetermined pattern using conventional techniques, such as stencil or printing. In step 2010, the second laminate layer 1308 may be attached to the top side of the substrate 1306 to form the second opening 1310. The second IMU 1316 may be attached to the top side of the substrate 1306 within the second opening 1310. The MCU 1318 may also be attached to the top side of the substrate 1306. In step 2012, a reflow, deflux, and baking process may be performed to secure the second laminate layer 1308, the second IMU 1316, and the MCU 1318. In step 2014, the TCP 1314 may be dispensed. In an example, the TCP 1314 may be dispense one side of the substrate 1306 first, cured, and then dispensed on the opposite side of the substrate 1306 and cured. For example, the TCP 1314 may be dispensed around the second IMU 1316 in the second opening 1310 and cured. Next, the TCP 1314 may be dispensed around the first IMU 1312 in the first opening 1304 and cured. In another example, the TCP 1314 may be dispensed in the first opening 1304 and the second opening 1310 at the same time and cured together.

Although aspects of the microelectronics package and methods of forming the microelectronics package have been disclosed in the context of selected representative examples, it will be understood by those skilled in the art that this disclosure extends beyond the specifically disclosed examples to other alternative examples and/or uses and obvious modifications and equivalents thereof. In addition, while different variations have been shown and described in detail, other modifications, which are within the scope of this disclosure, will be readily apparent to those of skill in the art based upon this disclosure. It is also contemplated that various combinations or sub-combinations of the specific features and aspects of the examples may be made and still fall within the scope of the disclosure. Various features and aspects of the disclosed examples may be combined with, or substituted for, one another in order to form varying modes of the disclosed microelectronics package. Thus, it is intended that the scope of this disclosure should not be limited by the particular examples described above.

We claim:

1. A package comprising:
a base comprising a first portion surrounded by a second portion;
an elastomer pad on the first portion;
a sub-assembly on the elastomer pad;
a connector assembly including a first electrical connector positioned in an opening in the base, a second electrical connector on the sub-assembly, and a flexible electrical connection electrically connected to the first electrical connector at a first connection point and electrically connected to the second electrical connector at a second connection point;
a connection seal hermetically sealing the first connection point of the first electrical connector in the opening between the flexible electrical connector and the first portion of the base; and
a lid attached to at least the second portion, the lid forming a hermetically-sealed cavity defined by an upper surface of the first portion, the connector assembly, and an inner surface of the lid.

2. The package of claim 1, wherein the sub-assembly comprises:
a first laminate layer on the elastomer pad, the first laminate layer comprising a first opening;
a substrate on the first laminate layer;
a semiconductor chip attached to a lower surface of the substrate, the semiconductor chip within the first opening; and
a first thermal paste in the first opening, the first thermal paste surrounding the semiconductor chip.

3. The package of claim 2, wherein the semiconductor chip comprises a first micro-electro-mechanical systems (MEMS) sensor.

4. The package of claim 3, further comprising:
an integrated circuit chip (IC) on an upper surface of the substrate.

5. The package of claim 4, further comprising:
a second laminate layer on the upper surface of the substrate, the second laminate layer comprising a second opening;
a second MEMS sensor attached to the upper surface of the substrate, the second MEMS sensor within the second opening; and
a second thermal paste in the second opening, the second thermal paste surrounding the second MEMS sensor.

6. The package of claim 1, wherein a thickness of the first portion is greater than a thickness of the second portion.

7. The package of claim 1, wherein the connector assembly comprises a connector pin and the flexible electrical connection comprises a flat flexible cable.

8. The package of claim 1, wherein the connector assembly comprises a connector and an interposer.

9. The package of claim 1, wherein the lid is attached to the second portion via an adhesive.

10. The package of claim 1, wherein the connector assembly is attached to the first portion via an adhesive.

11. The package of claim 1, where in the MEMS sensor comprises an inertial measurement unit (IMU).

12. A method of forming a package comprising:
forming an elastomer pad on a first portion of a base;
forming a sub-assembly on the elastomer pad;
attaching a connector assembly to the first portion, the connector assembly extending through an opening in the base;
connecting the sub-assembly and the connector assembly via a flexible electrical connection, wherein the forming the sub-assembly on the elastomer pad comprises:
forming a first laminate layer on the elastomer pad, the first laminate layer comprising a first opening;
forming a substrate on the first laminate layer;
attaching a semiconductor chip to a lower surface of the substrate, the semiconductor chip within the first opening; and
depositing a first thermal paste in the first opening, such that it surrounds the semiconductor chip; and
attaching a lid to at least a second portion of the base to form a hermetically-sealed cavity defined by an upper surface of the first portion, the connector assembly, and an inner surface of the lid, the second portion surrounding the first portion.

13. The method of claim 12, wherein the semiconductor chip comprises a first MEMS sensor.

14. The method of claim 13, further comprising:
attaching an IC to an upper surface of the substrate.

15. The method of claim 14, further comprising:
forming a second laminate layer on the upper surface of the substrate, the second laminate layer comprising a second opening;
attaching a second MEMS sensor to the upper surface of the substrate, the second MEMS sensor within the second opening; and
depositing a second thermal paste in the second opening, such that it surrounds the second MEMS sensor.

16. The method of claim 12, wherein a thickness of the first portion is greater than a thickness of the second portion.

17. The method of claim 12, wherein the connector assembly comprises a connector pin and the flexible electrical connection comprises a flat flexible cable.

18. The method of claim 12, wherein the connector assembly comprises a connector and an interposer.

19. The method of claim 12, wherein the attaching the lid to the second portion comprises adhesive bonding.

20. The method of claim 12, wherein the attaching the connector assembly to the first portion comprises adhesive bonding.

21. The method of claim 13, where in the MEMS sensor comprises an IMU.

* * * * *